(12) United States Patent
Kuramochi et al.

(10) Patent No.: US 8,114,714 B2
(45) Date of Patent: Feb. 14, 2012

(54) ELECTRONIC DEVICE AND PRODUCTION METHOD THEREOF

(75) Inventors: Satoru Kuramochi, Tokyo (JP); Yoshitaka Fukuoka, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 1219 days.

(21) Appl. No.: 11/837,763

(22) Filed: Aug. 13, 2007

(65) Prior Publication Data

US 2007/0287230 A1 Dec. 13, 2007

Related U.S. Application Data

(62) Division of application No. 10/980,307, filed on Nov. 4, 2004, now Pat. No. 7,772,684.

(30) Foreign Application Priority Data

Nov. 12, 2003 (JP) .................................. 2003-382109

(51) Int. Cl.
*H01L 21/82* (2006.01)

(52) U.S. Cl. ........ 438/128; 438/122; 438/123; 438/124; 438/125; 438/126; 257/686; 257/678; 257/E23.01

(58) Field of Classification Search .......... 257/210–211, 257/503, 508, E33.062–33.066, E31.124–31.126, 257/E51.019, 98, 100, 584–688; 438/98, 438/100, 584–688

See application file for complete search history.

(56) References Cited

U.S. PATENT DOCUMENTS

| | | | | |
|---|---|---|---|---|
| 6,570,469 | B2 * | 5/2003 | Yamada et al. | 333/193 |
| 6,872,893 | B2 * | 3/2005 | Fukuoka et al. | 174/255 |
| 2005/0012217 | A1 * | 1/2005 | Mori et al. | 257/758 |
| 2005/0258447 | A1 * | 11/2005 | Oi et al. | 257/100 |
| 2006/0185141 | A1 * | 8/2006 | Mori et al. | 29/25.41 |

* cited by examiner

*Primary Examiner* — N Drew Richards
*Assistant Examiner* — Mamadou Diallo
(74) *Attorney, Agent, or Firm* — Oblon, Spivak, McClelland, Maier & Neustadt, L.L.P.

(57) ABSTRACT

An object is to provide an electronic device of a multilayer structure with high density and high reliability that can be reduced in size while incorporating an electronic component therein, and further provide a production method for easily producing such an electronic device. An electronic device of the present invention includes wiring layers and electrically insulating layers stacked on a core board and establishes predetermined electrical conduction between the wiring layers through upper-lower side conducting vias provided in the electrically insulating layers. An electronic component incorporating layer formed by directly forming a lower layer and insulating resin layer having a cutout portion for receiving an electronic component therein and upper-lower side conducting vias and by incorporating the electronic component in the cutout portion is provided at least between one of the wiring layers and one of the electrically insulating layers and/or between the core board and the electrically insulating layer. At least the uppermost-layer electronic component incorporating layer of electronic incorporating layers has a metal frame body surrounding the electronic component and the upper-lower side conducting vias, and a metal cap having a flange portion fixed to the metal frame body of the uppermost-layer electronic component incorporating layer is provided.

34 Claims, 15 Drawing Sheets

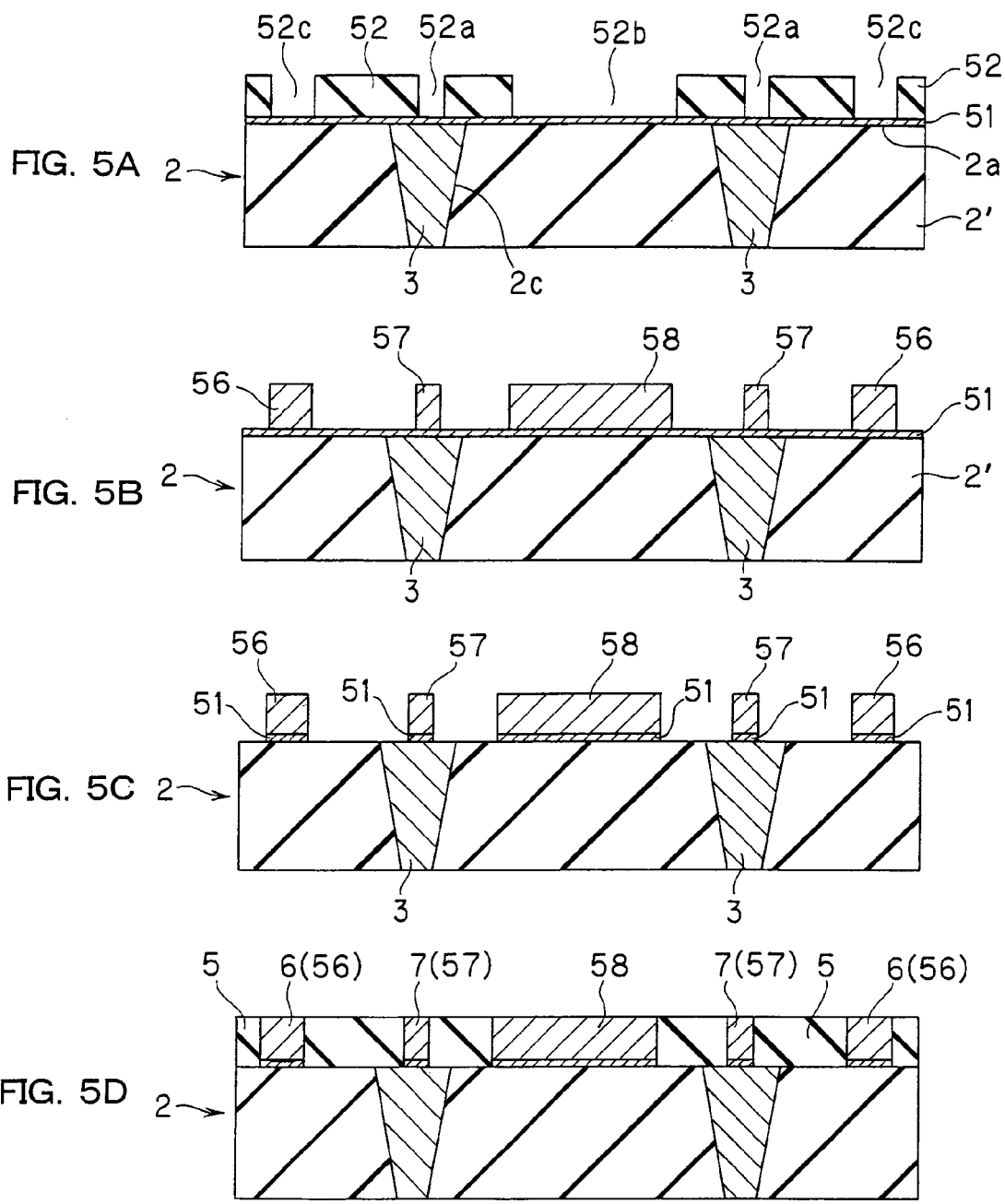

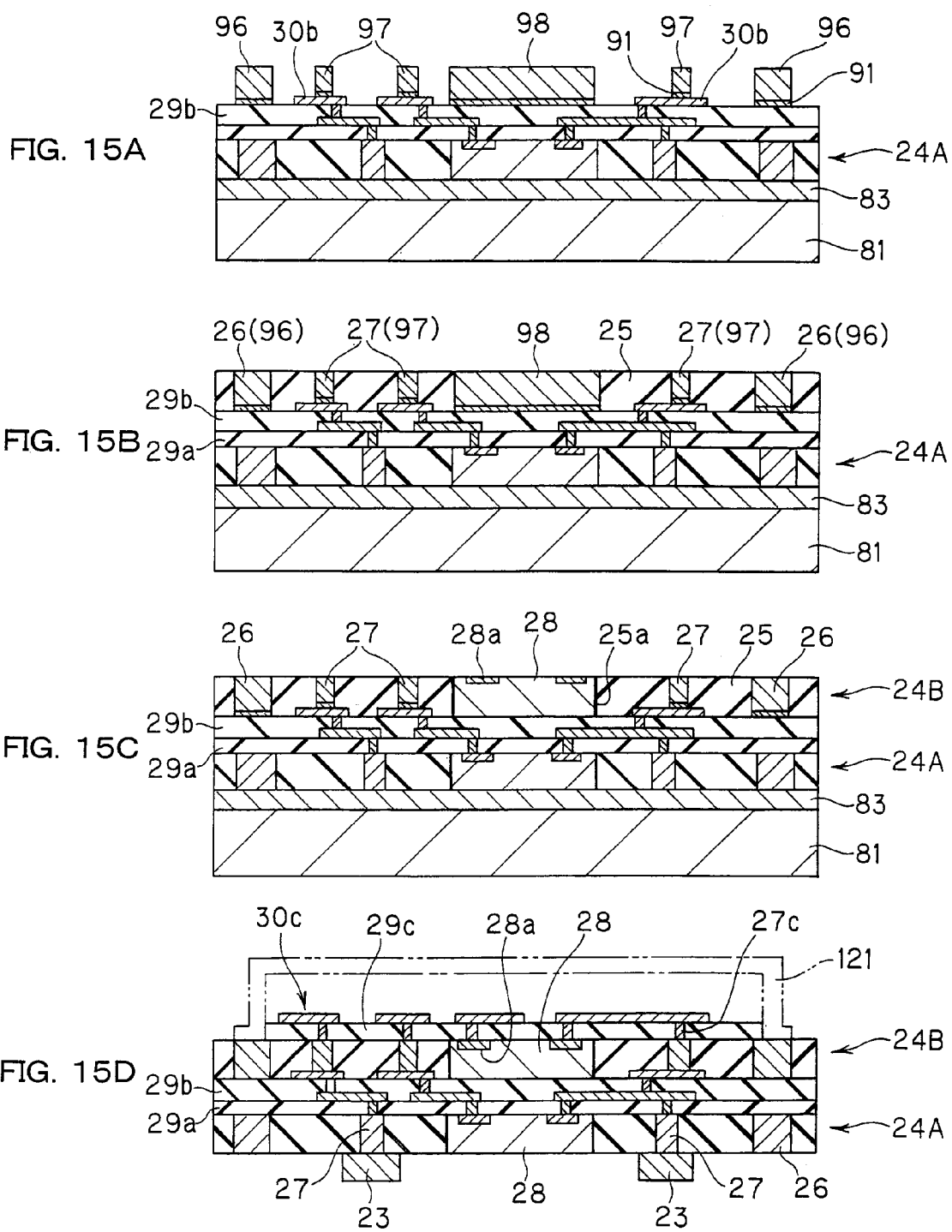

US 8,114,714 B2

ELECTRONIC DEVICE AND PRODUCTION METHOD THEREOF

CROSS REFERENCE TO RELATED APPLICATION

This application is a divisional of U.S. Ser. No. 10/980,307 which was filed Nov. 4, 2004 and claims priority to JP 2003-382109 filed Nov. 12, 2003, the entire contents of which are incorporated herein by reference, and claims priority under 35 U.S.C. §120 to this application.

BACKGROUND OF THE INVENTION

The present invention relates to an electronic device, particularly an electronic device having an electronic component such as an LSI chip incorporated therein, and further relates to a production method of such an electronic device.

A conventional multilayer wiring board is produced by, for example, using as a core board a double-sided board having low density wiring formed by the subtractive method or the like, and forming high density wiring on each side of the core board by the buildup method. On the other hand, the bare chip mounting method has been recently proposed wherein an LSI chip or the like is directly mounted onto a multilayer wiring board. In the bare chip mounting method, a semiconductor chip is mounted onto a connection pad portion of wiring formed on a multilayer wiring board in advance, by the use of connection means such as a bonding wire, bumps formed by solder, metal balls or the like, an anisotropic conductive film, a conductive adhesive, or a photocontractive resin. When a producing semiconductor device requires an LCR circuit component such as a capacitor or an inductor, it is externally mounted onto the multilayer wiring board like the semiconductor chip.

However, since the connection pad portion of the wiring formed on the multilayer wiring board is located at a position different from a mounting position of the electronic component such as the semiconductor chip, it is required that the multilayer wiring board be broadened in a plane direction. Consequently, size reduction of an electronic device is limited and tends to become further difficult as the number of electronic components to be mounted increases.

For coping therewith, a method is disclosed wherein a plurality of thin boards with semiconductor chips mounted thereon and a plurality of perforated frame boards having upper-lower side conducting vias are prepared in advance and, when producing an electronic device, each of the mounting boards and each of the frame boards are handled en bloc as one module and these modules are stacked in layers (JP-A-2002-343934, JP-A-2002-368185). In this method, even if the plurality of modules are layered, broadening in a plane direction of the electronic device is not required so that size reduction thereof is enabled.

On the other hand, use has been made of an electronic device that has a metal cap attached to an insulating region on the surface thereof by the use of an adhesive to thereby bear moisture resistance and electromagnetic interference resistance.

In the foregoing electronic device having the layered modules, however, connection means such as an anisotropic conductive film, a conductive adhesive, or a conductive paste is used for connection between each of the upper-lower side conducting vias forming the module and a corresponding one of wiring layers located under those vias, and there has been a problem that the width of selection of the connection means is narrowed in order to ensure a durability, particularly a durability excellent in temperature cycle. Further, there has also been a problem that fine-pitch connection between the layers is restricted. Moreover, in the conventional electronic device attached with the metal cap, there has also been a problem that the metal cap fixed with the adhesive falls off due to temperature cycle, or the heat conduction to the metal cap is poor due to the adhesive or an insulating member interposed between the metal cap and the electronic device so that the heat radiation effect by the metal cap is hardly achieved.

SUMMARY OF THE INVENTION

It is an object of the present invention to provide an electronic device of a multilayer structure with high density and high reliability that can be reduced in size while incorporating an electronic component therein, and further provide a production method for easily producing such an electronic device.

For accomplishing the foregoing object, the present invention is configured as an electronic device having wiring layers and electrically insulating layers stacked on a core board and establishing predetermined electrical conduction between the wiring layers through upper-lower side conducting vias provided in the electrically insulating layers, the electronic device comprising a plurality of electronic component incorporating layers each having an insulating resin layer, an electronic component incorporated in the insulating resin layer, and an upper-lower side conducting via provided in the insulating resin layer, the electronic component incorporating layer provided at least between one of the wiring layers and one of the electrically insulating layers and/or between the core board and the electrically insulating layer, wherein each of the electronic component incorporating layers is formed by directly forming on a lower layer the insulating resin layer having a cutout portion for receiving the electronic component therein and the upper-lower side conducting via and by incorporating the electronic component in the cutout portion, and at least the uppermost-layer electronic component incorporating layer of the plurality of electronic component incorporating layers comprises a metal frame body surrounding the electronic component and the upper-lower side conducting via, and a metal cap having a flange portion fixed to the metal frame body of the uppermost-layer electronic component incorporating layer is provided.

Further, the present invention is configured as an electronic device having wiring layers and electrically insulating layers stacked on a core board and establishing predetermined electrical conduction between the wiring layers through upper-lower side conducting vias provided in the electrically insulating layers, the electronic device comprising a plurality of electronic component incorporating layers each having an insulating resin layer, an electronic component incorporated in the insulating resin layer, and an upper-lower side conducting via provided in the insulating resin layer, the electronic component incorporating layer provided at least between one of the wiring layers and one of the electrically insulating layers and/or between the core board and the electrically insulating layer, wherein each of the electronic component incorporating layers is formed by placing the electronic component on a lower layer and directly forming on the lower layer the insulating resin layer having the upper-lower side conducting via so as to incorporate the electronic component therein, and at least the uppermost-layer electronic component incorporating layer of the plurality of electronic component incorporating layers comprises a metal frame body surrounding the electronic component and the upper-lower side conducting via, and a metal cap having a flange portion fixed to the metal frame body of the uppermost-layer electronic component incorporating layer is provided.

Further, the present invention is configured as an electronic device having wiring layers and electrically insulating layers stacked on an external terminal wiring layer and establishing predetermined electrical conduction between the wiring layers and the external terminal wiring layer through upper-lower side conducting vias provided in the electrically insulating layers, the electronic device comprising a plurality of electronic component incorporating layers each having an insulating resin layer, an electronic component incorporated in the insulating resin layer, and an upper-lower side conducting via provided in the insulating resin layer, the electronic component incorporating layer provided at least between one of the wiring layers and one of the electrically insulating layers and/or between the external terminal wiring layer and the electrically insulating layer, wherein each of the electronic component incorporating layers is formed by directly forming on a lower layer the insulating resin layer having a cutout portion for receiving the electronic component therein and the upper-lower side conducting via and by incorporating the electronic component in the cutout portion, and at least the uppermost-layer electronic component incorporating layer of the plurality of electronic component incorporating layers comprises a metal frame body surrounding the electronic component and the upper-lower side conducting via, and a metal cap having a flange portion fixed to the metal frame body of the uppermost-layer electronic component incorporating layer is provided.

Further, the present invention is configured as an electronic device having wiring layers and electrically insulating layers stacked on an external terminal wiring layer and establishing predetermined electrical conduction between the wiring layers and the external terminal wiring layer through upper-lower side conducting vias provided in the electrically insulating layers, the electronic device comprising a plurality of electronic component incorporating layers each having an insulating resin layer, an electronic component incorporated in the insulating resin layer, and an upper-lower side conducting via provided in the insulating resin layer, the electronic component incorporating layer provided at least between one of the wiring layers and one of the electrically insulating layers and/or between the external terminal wiring layer and the electrically insulating layer, wherein each of the electronic component incorporating layers is formed by placing the electronic component on a lower layer and directly forming on the lower layer the insulating resin layer having the upper-lower side conducting via so as to incorporate the electronic component therein, and at least the uppermost-layer electronic component incorporating layer of the plurality of electronic component incorporating layers comprises a metal frame body surrounding the electronic component and the upper-lower side conducting via, and a metal cap having a flange portion fixed to the metal frame body of the uppermost-layer electronic component incorporating layer is provided.

The present invention is configured as a production method of an electronic device having wiring layers and electrically insulating layers stacked on a core board, establishing predetermined electrical conduction between the wiring layers through upper-lower side conducting vias provided in the electrically insulating layers, and incorporating an electronic component, the production method comprising the steps of forming a conductive columnar convex portion for an upper-lower side conducting via, a block body for formation of a cutout portion for receiving the electronic component therein, and a frame body surrounding them, on the core board or on the wiring layer formed on the core board via the electrically insulating layer; forming an insulating resin layer so as to expose a top portion of the conductive columnar convex portion and an upper surface of the block body that are surrounded by the frame body; and fitting the electronic component into the cutout portion formed by removing the block body to thereby form an electronic component incorporating layer having the electronic component incorporated in the insulating resin layer and the upper-lower side conducting via in the insulating resin layer.

Further, the present invention is configured as a production method of an electronic device having wiring layers and electrically insulating layers stacked on a core board, establishing predetermined electrical conduction between the wiring layers through upper-lower side conducting vias provided in the electrically insulating layers, and incorporating an electronic component, the production method comprising the steps of forming a conductive columnar convex portion for an upper-lower side conducting via and a frame body surrounding the conductive columnar convex portion, on the core board or on the wiring layer formed on the core board via the electrically insulating layer, and placing the electronic component inside the frame body; and forming an insulating resin layer so as to incorporate therein the electronic component surrounded by the frame body and expose a top portion of the conductive columnar convex portion and terminal portions of the electronic component to thereby form an electronic component incorporating layer having the electronic component incorporated in the insulating resin layer and the upper-lower side conducting via in the insulating resin layer.

Further, the present invention is configured as a production method of an electronic device having wiring layers and electrically insulating layers stacked on an external terminal wiring layer, establishing predetermined electrical conduction between the wiring layers and the external terminal wiring layer through upper-lower side conducting vias provided in the electrically insulating layers, and incorporating an electronic component, the production method comprising the steps of forming a conductive columnar convex portion for an upper-lower side conducting via, a block body for formation of a cutout portion for receiving the electronic component therein, and a frame body surrounding them, on a metal conductive layer formed on a base member or on the wiring layer formed on the metal conductive layer via the electrically insulating layer; forming an insulating resin layer so as to expose a top portion of the conductive columnar convex portion and an upper surface of the block body that are surrounded by the frame body; fitting the electronic component into the cutout portion formed by removing the block body to thereby form an electronic component incorporating layer having the electronic component incorporated in the insulating resin layer and the upper-lower side conducting via in the insulating resin layer; and removing the base member to expose the metal conductive layer and then pattern etching the metal conductive layer to form external terminal wiring.

Further, the present invention is configured as a production method of an electronic device having wiring layers and electrically insulating layers stacked on an external terminal wiring layer, establishing predetermined electrical conduction between the wiring layers and the external terminal wiring layer through upper-lower side conducting vias provided in the electrically insulating layers, and incorporating an electronic component, the production method comprising the steps of forming a conductive columnar convex portion for an upper-lower side conducting via and a frame body surrounding the conductive columnar convex portion, on a metal conductive layer formed on a base member or on the wiring layer formed on the metal conductive layer via the electrically insulating layer; forming an insulating resin layer so as to incorporate therein the electronic component surrounded by the frame body and expose a top portion of the conductive columnar convex portion and terminal portions of the electronic component to thereby form an electronic component incorporating layer having the electronic component incorporated in the insulating resin layer and the upper-lower side conducting via in the insulating resin layer; and removing the base member to expose the metal conductive layer and then pattern etching the metal conductive layer to form external terminal wiring.

In the electronic device of the present invention, since the flange portion of the metal cap is fixed to the metal frame body of the uppermost-layer electronic component incorporating layer, falling off of the metal cap due to temperature cycle is prevented and further the heat radiation effect through the metal cap is achieved. Moreover, as compared with the conventional case where electronic components are externally mounted, size reduction of the electronic device is enabled. Further, as different from the conventional electronic device produced by stacking separate modules at a predetermined position by the use of connection means such as an anisotropic conductive film, a conductive adhesive, or a conductive paste, there is achieved an effect that fine-pitch connection is enabled, and further, high heat resistance and thus high reliability can be ensured.

Further, in the production method of the electronic device of the present invention, the insulating resin layer having a sufficient thickness for incorporating the electronic component can be formed using the frame body surrounding the conductive columnar convex portion and the block body or the electronic component when forming the electrically insulating layer and the wiring layer that constitute the electronic device, so that the electronic component incorporating layers can be directly formed and stacked. Therefore, as compared with the conventional method of joining and stacking separate modules, the electrical conduction between the respective layers can be reliably achieved and further it is not necessary to select and use connection means having high heat resistance, so that there is achieved an effect that the electronic device with high density and high reliability can be obtained. Further, by leaving the metal frame body in the uppermost-layer electronic component incorporating layer of each of the electronic devices panelized, the flange portion of the metal cap can be directly fixed to the metal frame body, thereby enabling formation of the electronic device of the present invention.

BRIEF DESCRIPTION OF THE DRAWINGS

FIGS. 5A to 5D are process diagrams showing a first preferred embodiment of a production method of the electronic device according to the present invention;

FIGS. 15A to 15D are process diagrams showing the third embodiment of the production method of the electronic device according to the present invention;

DESCRIPTION OF THE PREFERRED EMBODIMENT

Figure 1:
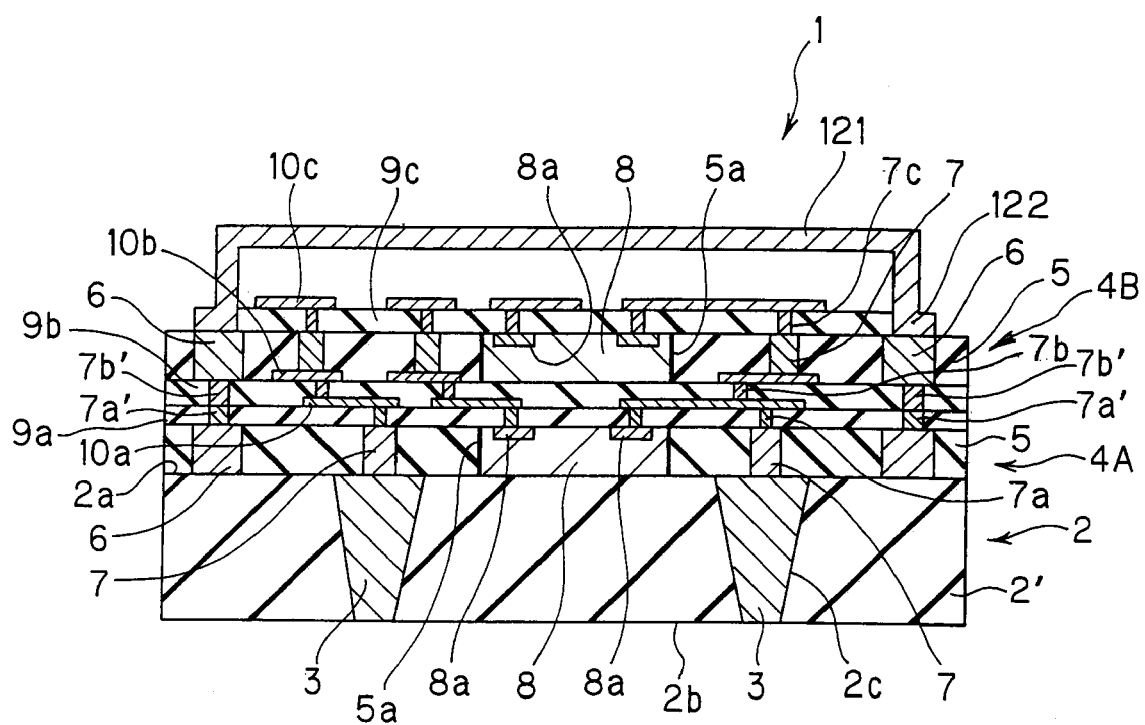
FIG. 1 is a schematic longitudinal sectional view showing a first preferred embodiment of an electronic device of the present invention.

Now, preferred embodiments of the present invention will be described with reference to the drawings.
Electronic Device First Embodiment of Electronic Device FIG. 1 is a schematic longitudinal sectional view showing one embodiment of an electronic device of the present invention. In FIG. 1, an electronic device 1 of the present invention comprises a core board 2, and wiring layers, electrically insulating layers, electronic component incorporating layers, and a metal cap which are formed on one surface 2a of the core board 2.

The core board 2 constituting the electronic device 1 comprises a core member 2' and a plurality of through holes 2c formed in the core member 2', and each through hole 2c is filled with a conductive material 3 so that electrical conduction between the front surface 2a and a back surface 2b of the core board 2 is established via each through hole 2c by the use of the conductive material 3. Each through hole 2c may have a straight shape having a substantially uniform inner diameter, a tapered shape in which an opening diameter at its one end is greater than that at its other end, a shape in which an inner diameter at its center differs from opening diameters at its both ends, or another shape. In the illustrated example, the opening diameter of the through hole 2c on the side of the front surface 2a of the core board 2 is set greater than that on the opposite side (the side of the back surface 2b of the core board 2) and therefore the through hole 2c has a tapered shape.

An electronic component incorporating layer 4A is formed on the surface 2a of the core board 2 constituting the electronic device 1. The electronic component incorporating layer 4A comprises an insulating resin layer 5, an electronic component 8 received in a cutout portion 5a formed in the insulating resin layer 5, and upper-lower side conducting vias 7 and further comprises a metal frame body 6 disposed near a peripheral portion of the insulating resin layer 5 so as to surround the upper-lower side conducting vias 7 and the electronic component 8. In the electronic component incorporating layer 4A, the upper-lower side conducting vias 7 are connected to the conductive materials 3 of the corresponding predetermined through holes 2c, respectively. In the illustrated example, the numbers of the upper-lower side conducting vias 7, the electronic components 8, and the later-described wiring layers and electrically insulating layers are abbreviated for facilitating the description.

The electronic component incorporating layer 4A is formed such that the insulating resin layer 5 having the cutout portion 5a for receiving the electronic component 8 therein, the upper-lower side conducting vias 7, and the metal frame body 6 disposed surrounding them is directly formed on the surface 2a of the core board 2 and the electronic component 8 is disposed in the cutout portion 5a. Note that the electronic component 8 may be in the form of one kind or more of LSI chip, IC chip, LCR electronic component, and sensor component, and a plurality of electronic components 8 may be incorporated.

On the electronic component incorporating layer 4A, first-layer wiring layers 10a are formed via a first-layer electrically insulating layer 9a so as to be connected to the upper-lower side conducting vias 7 and terminal portions 8a of the electronic component 8 of the electronic component incorporating layer 4A by the use of upper-lower side conducting vias 7a. Further, on the first-layer wiring layers 10a, second-layer wiring layers 10b are formed via a second-layer electrically insulating layer 9b so as to be connected to the predetermined first-layer wiring layers 10a by the use of upper-lower side conducting vias 7b, respectively. In the illustrated example, a first-layer wiring frame 7a' is provided so as to be located on the metal frame body 6 and a second-layer wiring frame 7b' is further provided so as to be located on the first-layer wiring frame 7a'. Wiring layers may further be stacked depending on necessity.

An electronic component incorporating layer 4B is formed on the second-layer wiring layers 10b. Like the electronic component incorporating layer 4A, the electronic component incorporating layer 4B also comprises an insulating resin layer 5, an electronic component 8 received in a cutout portion 5a formed in the insulating resin layer 5, and upper-lower side conducting vias 7 and further comprises a metal frame body 6 disposed near a peripheral portion of the insulating resin layer 5 so as to surround the upper-lower side conducting vias 7 and the electronic component 8. In the electronic component incorporating layer 4B, the metal frame body 6 is located on the wiring frame 7b' and the upper-lower side conducting vias 7 are connected to the predetermined second-layer wiring layers 10b, respectively.

The electronic component incorporating layer 4B is formed such that the insulating resin layer 5 having the cutout portion 5a for receiving the electronic component 8 therein, the upper-lower side conducting vias 7, and the metal frame body 6 disposed surrounding them is directly formed on the second-layer wiring layers 10b and the electronic component 8 is disposed in the cutout portion 5a. Note that the electronic component 8 may be in the form of one kind or more of LSI chip, IC chip, LCR electronic component, and sensor component, and a plurality of electronic components 8 may be incorporated, and further, it may differ from the electronic component 8 incorporated in the electronic component incorporating layer 4A.

The electronic component incorporating layer 4B is an uppermost-layer electronic component incorporating layer in the electronic device 1 of the illustrated example. On the electronic component incorporating layer 4B, third-layer wiring layers 10c are formed via a third-layer electrically insulating layer 9c so as to be connected to the upper-lower side conducting vias 7 and terminal portions 8a of the electronic component 8 of the electronic component incorporating layer 4B by the use of upper-lower side conducting vias 7c. Further, a flange portion 122 of a metal cap 121 is directly fixed to the metal frame body 6 of the electronic component incorporating layer 4B.

It may be configured that, like in a later-described second embodiment, the flange portion 122 of the metal cap 121 is fixed to the metal frame body 6 of the electronic component incorporating layer 4B via a third-layer wiring frame and a wiring frame conductor pattern.

According to the foregoing electronic device 1 of the present invention, since the electronic component incorporating layers 4A and 4B are provided in a stacked fashion, size reduction of the semiconductor device is enabled as compared with a case where electronic components are externally mounted. Further, since the flange portion 122 of the metal cap 121 is directly fixed to the metal frame body 6 of the uppermost-layer electronic component incorporating layer 4B with no resin adhesive interposed therebetween, falling off of the metal cap 121 due to temperature cycle is prevented and further the heat radiation effect through the metal cap 121 is achieved. Moreover, since the electronic component incorporating layers 4A and 4B are directly formed on the core board 2 and the wiring layers 10b, respectively, i.e. the electronic component incorporating layers 4A and 4B are not prepared separately in advance and stacked, connection means such as an anisotropic conductive film, a conductive adhesive, or a conductive paste does not exist between the layers and therefore the electronic device 1 has high heat resistance and is thus excellent in reliability.

Further, in the case where the wiring frames 7a' and 7b' are provided between the metal frame bodies 6 and 6 of the electronic component incorporating layers 4A and 4B as in the illustrated example, the inside of the electronic device 1 is sealed with the metal cap 121, the metal frame bodies 6 and 6, and the wiring frames 7a' and 7b' so that it is possible to prevent invasion of gas or the like from the exterior through the insulating resin layers 5 and 5 and the electrically insulating layers 9a, 9b, and 9c. In this case, it may be configured that portions of the insulating resin layers 5 and 5 and portions of the electrically insulating layers 9a and 9b located outside the metal frame bodies 6 and 6 and the wiring frames 7a' and 7b' are removed.

In the present invention, it is desirable that a thermal expansion coefficient in XY directions (the plane parallel to the front surface 2a (or the back surface 2b) of the core board 2) of the core board 2 falls within the range of 2 to 20 ppm, preferably 2.5 to 17 ppm. Such a core board 2 can be formed by the use of the core member 2' made of, for example, silicon, ceramics, glass, or a glass-epoxy composite material. On the other hand, as the conductive material 3 filled in each through hole 2c of the core board 2, use can be made of, for example, a known conductive paste containing conductive particles such as copper particles or silver particles. An electrically insulating film of silicon dioxide, silicon nitride, or the like may be formed on inner wall surfaces of the through holes 2c and the surface of the core member 2' according to necessity.

On the other hand, the conductive material 3 filled in each through hole 2c may be formed by filling copper into each through hole 2c by electrolytic plating. Alternatively, the conductive material 3 may be formed by forming a conductive film on the inner wall surface of each through hole 2c by electroless plating and then increasing the thickness of the conductive film by electroplating, and a conductive paste or resin may further be filled in.

In the present invention, the thermal expansion coefficient is measured by a TMA (thermomechanical analysis).

A material of the insulating resin layer 5 constituting each of the electronic component incorporating layers 4A and 4B can be an epoxy resin, a benzocyclobutene resin, a cardo resin, a polyimide resin, or the like. A material of the metal frame body 6 constituting each of the electronic component incorporating layers 4A and 4B, a material of the upper-lower side conducting vias 7, a material of the upper-lower side conducting vias 7a, 7b, and 7c, a material of the wiring frames 7a' and 7b', and a material of the wiring layers 10a, 10b, and 10c can be a conductive material such as copper, silver, gold, chromium, aluminum, or the like.

The shape of the metal frame body 6 is not particularly limited as long as it is formed to surround the upper-lower side conducting vias 7 and the electronic component 8, and can be suitably set to a ring shape, a corridor shape, or the like taking into account the shape of a metal cap to be used and so forth. Each of the wiring frames 7a' and 7b' can have a shape corresponding to the shape of the metal frame body 6.

A material of the electrically insulating layers 9a, 9b, and 9c can be an organic insulating material such as an epoxy resin, a benzocyclobutene resin, a cardo resin, or a polyimide resin, or an insulating material such as a combination such an organic insulating material and glass fibers or the like.

As the metal cap 121, use may be made of one formed of a metal material such as copper, aluminum, Kovar, or an iron/nickel 42 alloy, or one further formed on the surface thereof with a plating coat for preventing oxidation. The shape of the metal cap 121 is not limited to that shown in the figure. Nitrogen gas or inert gas may be filled in a space between the metal cap 121 and the third-layer wiring layers 10c. The fixation between the flange portion 122 of such a metal cap 121 and the metal frame body 6 can be carried out by brazing, welding, soldering, or the like.

In the foregoing embodiment, the electronic component incorporating layer 4A is provided therein with the metal frame body 6. However, the electronic component incorporating layer 4A is not necessarily provided with the metal frame body 6. Further, the wiring frames 7a' and 7b' may be omitted.

Further, in the foregoing embodiment, the electrical conduction is established between the front surface 2a and the back surface 2b of the core board 2 by filling the conductive material 3 in each through hole 2c. On the other hand, the electrical conduction between the front surface 2a and the back surface 2b may be achieved by, for example, stacking an insulating layer and a conductive thin film on the inner wall of each through hole 2c. In this case, the insulating layer can be an electrically insulating film of silicon dioxide, silicon nitride, or the like, while the conductive thin film can be a thin film composed of an under conductive thin film of copper, chromium, titanium, titanium nitride, nickel, or the like and a conductive material of copper, silver, gold, nickel, or the like layered on the under conductive thin film. When the electrical conduction between the front surface 2a and the back surface 2b is achieved with such a structure, a desired filling material such as a conductive paste or an insulating paste can be filled in each through hole 2c.

Further, in the foregoing embodiment, the wiring layers, the electrically insulating layers, and the electronic component incorporating layers are formed on one side (the surface 2a) of the core board 2. However, in the present invention, wiring layers, electrically insulating layers, and electronic component incorporating layers may be formed on both sides of the core board.

Further, as the core board 2, use may be made of one having an electronic component incorporated on the side of the surface 2a. Such incorporation of the electronic component onto the core board 2 can be achieved by forming a recess on the core board 2 by counterboring using a drill, sandblasting, or the like and fitting the electronic component into the recess. The electronic component in this case may also be in the form of one kind or more of LSI chip, IC chip, LCR electronic component, and sensor component, and a plurality of electronic components may be incorporated.

Second Embodiment of Electronic Device

Figure 2:
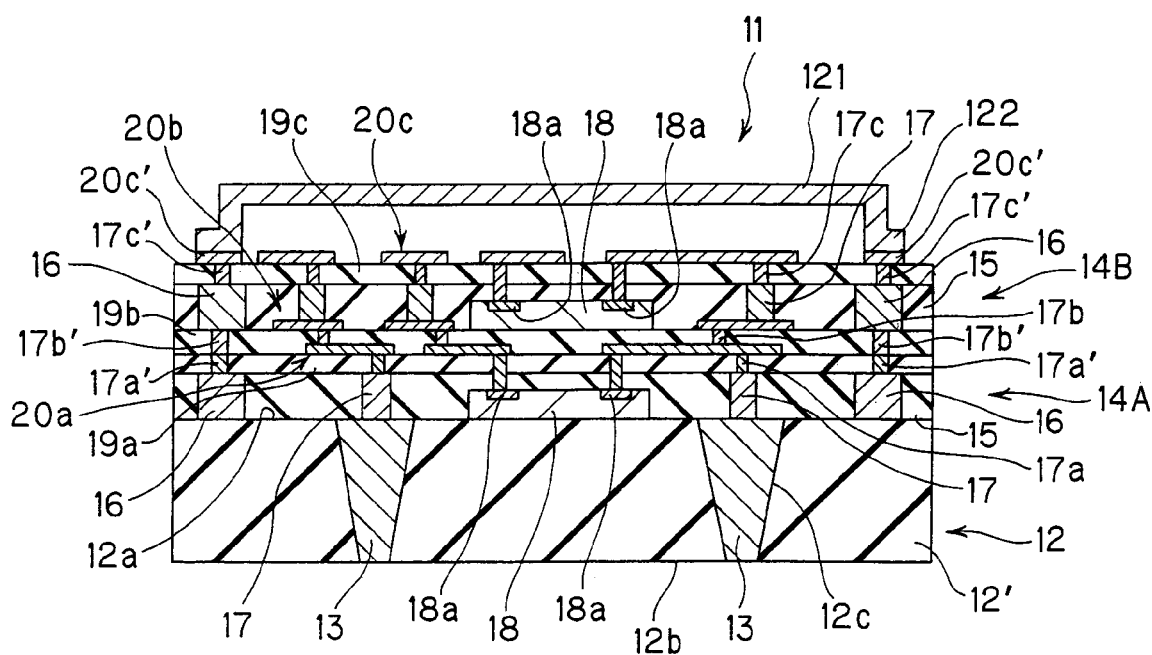
FIG. 2 is a schematic longitudinal sectional view showing a second preferred embodiment of an electronic device of the present invention.

FIG. 2 is a schematic longitudinal sectional view showing another embodiment of an electronic device of the present invention. In FIG. 2, an electronic device 11 of the present invention comprises a core board 12, and wiring layers, electrically insulating layers, electronic component incorporating layers, and a metal cap which are formed on one surface 12a of the core board 12.

The core board 12 constituting the electronic device 11 comprises a core member 12' and a plurality of through holes 12c formed in the core member 12', and each through hole 12c is filled with a conductive material 13 so that electrical conduction between the front surface 12a and a back surface 12b of the core board 12 is established via each through hole 12c by the use of the conductive material 13. In the illustrated example, each through hole 12c has a tapered shape.

An electronic component incorporating layer 14A is formed on the surface 12a of the core board 12 constituting the electronic device 11. The electronic component incorporating layer 14A comprises an insulating resin layer 15, an electronic component 18 incorporated in the insulating resin layer 15, and upper-lower side conducting vias 17 and further comprises a metal frame body 16 disposed near a peripheral portion of the insulating resin layer 15 so as to surround the upper-lower side conducting vias 17 and the electronic component 18. In the electronic component incorporating layer 14A, the upper-lower side conducting vias 17 are connected to the conductive materials 13 of the corresponding predetermined through holes 12c, respectively. In the illustrated example, the numbers of the upper-lower side conducting vias 17, the electronic components 18, and the later-described wiring layers and electrically insulating layers are abbreviated for facilitating the description.

The electronic component incorporating layer 14A is a layer provided by placing the electronic component 18 on the surface 12a of the core board 12 and directly forming the insulating resin layer 15 having the metal frame body 16 and the upper-lower side conducting vias 17 on the core board 12 so as to incorporate the electronic component 18 therein. Note that the electronic component 18 may be in the form of one kind or more of LSI chip, IC chip, LCR electronic component, and sensor component, and a plurality of electronic components 18 may be incorporated.

On the electronic component incorporating layer 14A, first-layer wiring layers 20a are formed via a first-layer electrically insulating layer 19a so as to be connected to the upper-lower side conducting vias 17 and terminal portions 18a of the electronic component 18 of the electronic component incorporating layer 14A by the use of upper-lower side conducting vias 17a. Further, on the first-layer wiring layers 20a, second-layer wiring layers 20b are formed via a second-layer electrically insulating layer 19b so as to be connected to the predetermined first-layer wiring layers 20a by the use of upper-lower side conducting vias 17b, respectively. In the illustrated example, a first-layer wiring frame 17a' is provided so as to be located on the metal frame body 16 and a second-layer wiring frame 17b' is further provided so as to be located on the first-layer wiring frame 17a'. Wiring layers may further be stacked depending on necessity.

An electronic component incorporating layer 14B is formed on the second-layer wiring layers 20b. Like the electronic component incorporating layer 14A, the electronic component incorporating layer 14B also comprises an insulating resin layer 15, an electronic component 18 incorporated in the insulating resin layer 15, and upper-lower side conducting vias 17 and further comprises a metal frame body 16 disposed near a peripheral portion of the insulating resin layer 15 so as to surround the upper-lower side conducting vias 17 and the electronic component 18. In the electronic component incorporating layer 14B, the metal frame body 16 is located on the wiring frame 17b' and the upper-lower side conducting vias 17 are connected to the predetermined second-layer wiring layers 20b, respectively.

The electronic component incorporating layer 14B is a layer provided by placing the electronic component 18 on the second-layer wiring layers 20b and directly forming the insulating resin layer 15 having the metal frame body 16 and the upper-lower side conducting vias 17 on the wiring layers 20b so as to incorporate the electronic component 18 therein. Note that the electronic component 18 may be in the form of one kind or more of LSI chip, IC chip, LCR electronic component, and sensor component, and a plurality of electronic components 18 may be incorporated, and further, it may differ from the electronic component 18 incorporated in the electronic component incorporating layer 14A.

The electronic component incorporating layer 14B is an uppermost-layer electronic component incorporating layer in the electronic device 11 of the illustrated example. On the electronic component incorporating layer 14B, third-layer wiring layers 20c are formed via a third-layer electrically insulating layer 19c so as to be connected to the upper-lower side conducting vias 17 and terminal portions 18a of the electronic component 18 of the electronic component incorporating layer 14B by the use of upper-lower side conducting vias 17c. In the illustrated example, a wiring frame conductor pattern 20c' is provided via the third-layer electrically insulating layer 19c so as to be connected to the metal frame body 16 through a third-layer wiring frame 17c'. Further, a flange portion 122 of a metal cap 121 is fixed to the metal frame body 16 of the electronic component incorporating layer 14B via the third-layer wiring frame 17c' and the wiring frame conductor pattern 20c'.

According to the foregoing electronic device 11 of the present invention, since the electronic component incorporating layers 14A and 14B are provided in a stacked fashion, size reduction of the semiconductor device is enabled as compared with a case where electronic components are externally mounted. Further, since the flange portion 122 of the metal cap 121 is directly fixed to the metal frame body 16 of the uppermost-layer electronic component incorporating layer 14B with no resin adhesive interposed therebetween, falling off of the metal cap 121 due to temperature cycle is prevented and further the heat radiation effect through the metal cap 121 is achieved. Moreover, since the electronic component incorporating layers 14A and 14B are directly formed on the core board 12 and the wiring layers 20b, respectively, i.e. the electronic component incorporating layers 14A and 14B are not prepared separately in advance and stacked, connection means such as an anisotropic conductive film, a conductive adhesive, or a conductive paste does not exist between the layers and therefore the electronic device 11 has high heat resistance and is thus excellent in reliability.

Further, in the case where the wiring frames 17a' and 17b' are provided between the metal frame bodies 16 and 16 of the electronic component incorporating layers 14A and 14B and further the third-layer wiring frame 17c' and the wiring frame conductor pattern 20c' are provided as in the illustrated example, the inside of the electronic device 11 is sealed with the metal cap 121, the metal frame bodies 16 and 16, the wiring frames 17a', 17b', and 17c', and the wiring frame conductor pattern 20c' so that it is possible to prevent invasion of gas or the like from the exterior through the insulating resin layers 15 and 15 and the electrically insulating layers 19a, 19b, and 19c. In this case, it may be configured that portions of the insulating resin layers 15 and 15 and portions of the electrically insulating layers 19a, 19b, and 19c located outside the metal frame bodies 16 and 16 and the wiring frames 17a', 17b', and 17c' are removed.

The core board 12 constituting the foregoing electronic device 11 can be formed by using the same materials as the foregoing core board 2.

A material of the insulating resin layer 15 constituting each of the electronic component incorporating layers 14A and 14B can be the same as that of the insulating resin layer 5 constituting each of the electronic component incorporating layers 4A and 4B in the foregoing first embodiment. A material of the metal frame body 16 constituting each of the electronic component incorporating layers 14A and 14B, a material of the upper-lower side conducting vias 17, a material of the upper-lower side conducting vias 17a, 17b, and 17c, a material of the wiring frames 17a', 17b', and 17c', a material of the wiring layers 20a, 20b, and 20c, and a material of the wiring frame conductor pattern 20c' can be the same as that of the metal frame bodies, the upper-lower side conducting vias, the wiring frames, and the wiring layers in the foregoing first embodiment. Further, a material of the electrically insulating layers 19a, 19b, and 19c can be the same as that of the electrically insulating layers in the foregoing first embodiment.

The shape of the metal frame body 16 is not particularly limited as long as it is formed to surround the upper-lower side conducting vias 17 and the electronic component 18, and can be suitably set to a ring shape, a corridor shape, or the like taking into account the shape of a metal cap to be used and so forth. Each of the wiring frames 17a', 17b', and 17c' and the wiring frame conductor pattern 20c' can have a shape corresponding to the shape of the metal frame body 16.

In the foregoing embodiment, the electronic component incorporating layer 14A is provided therein with the metal frame body 16. However, the electronic component incorporating layer 14A is not necessarily provided with the metal frame body 16. Further, like in the foregoing first embodiment, it may be configured that the flange portion 122 of the metal cap 121 is directly fixed to the metal frame body 16 of the electronic component incorporating layer 14B.

Further, the core board 12 may be configured such that the electrical conduction between the front surface 12a and the back surface 12b is achieved by stacking an insulating layer and a conductive thin film on the inner wall of each through hole 12c.

In the foregoing embodiment, the wiring layers, the electrically insulating layers, and the electronic component incorporating layers are formed on one side (the surface 12a) of the core board 12. However, in the present invention, wiring layers, electrically insulating layers, and electronic component incorporating layers may be formed on both sides of the core board.

Like in the foregoing first embodiment, as the core board 12, use may be made of one having an electronic component incorporated on the side of the surface 12a. Alternatively, use may be made of one having electronic components incorporated on both sides of the core board 12.

Third Embodiment of Electronic Device

Figure 3:
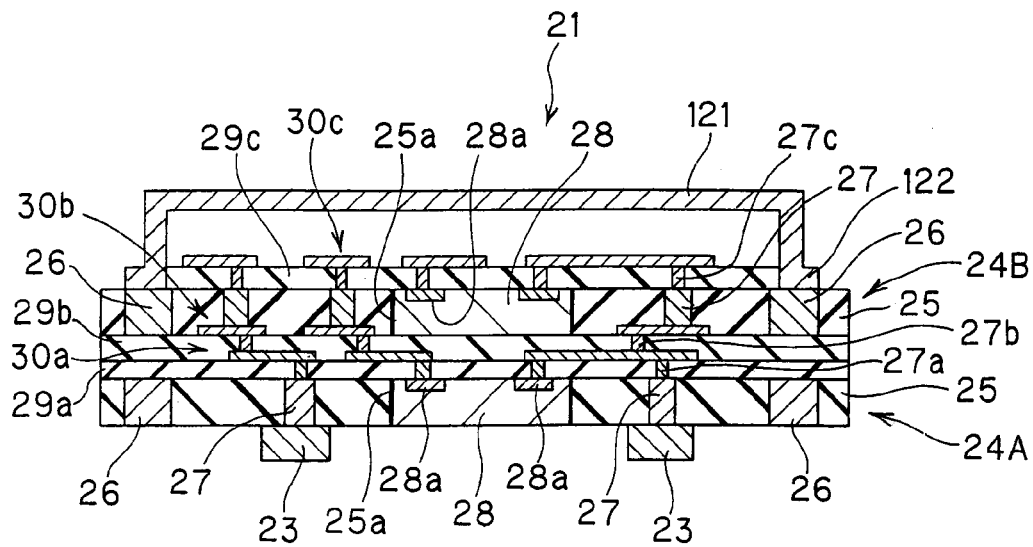
FIG. 3 is a schematic longitudinal sectional view showing a third preferred embodiment of an electronic device of the present invention.

FIG. 3 is a schematic longitudinal sectional view showing another embodiment of an electronic device of the present invention. In FIG. 3, an electronic device 21 of the present invention comprises a stacked or layered body having wiring layers, electrically insulating layers, and electronic component incorporating layers, external terminal wiring layers, and a metal cap.

In the electronic device 21, an electronic component incorporating layer 24A is formed on external terminal wiring layers 23. The electronic component incorporating layer 24A comprises an insulating resin layer 25, an electronic component 28 received in a cutout portion 25a formed in the insulating resin layer 25, and upper-lower side conducting vias 27 and further comprises a metal frame body 26 disposed near a peripheral portion of the insulating resin layer 25 so as to surround the upper-lower side conducting vias 27 and the electronic component 28. The upper-lower side conducting vias 27 are connected to the corresponding predetermined external terminal wiring layers 23, respectively. In the illustrated example, the numbers of the external terminal wiring layers 23, the upper-lower side conducting vias 27, the electronic components 28, and the later-described wiring layers and electrically insulating layers are abbreviated for facilitating the description.

The electronic component incorporating layer 24A is formed such that the insulating resin layer 25 having the cutout portion 25a for receiving the electronic component 28 therein, the upper-lower side conducting vias 27, and the metal frame body 26 disposed surrounding them is directly formed on the external terminal wiring layers 23 and the electronic component 28 is disposed in the cutout portion 25a. Note that "on the external terminal wiring layers 23" as mentioned above is a concept including "on a metal conductive layer to be formed into the external terminal wiring layers 23". The electronic component 28 may be in the form of one kind or more of LSI chip, IC chip, LCR electronic component, and sensor component, and a plurality of electronic components 28 may be incorporated.

On the electronic component incorporating layer 24A, first-layer wiring layers 30a are formed via a first-layer electrically insulating layer 29a so as to be connected to the upper-lower side conducting vias 27 and terminal portions 28a of the electronic component 28 of the electronic component incorporating layer 24A by the use of upper-lower side conducting vias 27a. Further, on the first-layer wiring layers 30a, second-layer wiring layers 30b are formed via a second-layer electrically insulating layer 29b so as to be connected to the predetermined first-layer wiring layers 30a by the use of upper-lower side conducting vias 27b, respectively. Wiring layers may further be stacked depending on necessity.

An electronic component incorporating layer 24B is formed on the second-layer wiring layers 30b. Like the electronic component incorporating layer 24A, the electronic component incorporating layer 24B also comprises an insulating resin layer 25, an electronic component 28 received in a cutout portion 25a formed in the insulating resin layer 25, and upper-lower side conducting vias 27 and further comprises a metal frame body 26 disposed near a peripheral portion of the insulating resin layer 25 so as to surround the upper-lower side conducting vias 27 and the electronic component 28. The upper-lower side conducting vias 27 are connected to the predetermined second-layer wiring layers 30b, respectively.

The electronic component incorporating layer 24B is formed such that the insulating resin layer 25 having the cutout portion 25a for receiving the electronic component 28 therein, the upper-lower side conducting vias 27, and the metal frame body 26 disposed surrounding them is directly formed on the second-layer wiring layers 30b and the electronic component 28 is disposed in the cutout portion 25a. Note that the electronic component 28 may be in the form of one kind or more of LSI chip, IC chip, LCR electronic component, and sensor component, and a plurality of electronic components 28 may be incorporated, and further, it may differ from the electronic component 28 incorporated in the electronic component incorporating layer 24A.

The electronic component incorporating layer 24B is an uppermost-layer electronic component incorporating layer in the electronic device 21 of the illustrated example. On the electronic component incorporating layer 24B, third-layer wiring layers 30c are formed via a third-layer electrically insulating layer 29c so as to be connected to the upper-lower side conducting vias 27 and terminal portions 28a of the electronic component 28 of the electronic component incorporating layer 24B by the use of upper-lower side conducting vias 27c. Further, a flange portion 122 of a metal cap 121 is directly fixed to the metal frame body 26 of the electronic component incorporating layer 24B.

It may be configured that, like in the foregoing second embodiment, the flange portion 122 of the metal cap 121 is fixed to the metal frame body 26 of the electronic component incorporating layer 24B via a wiring frame conductor pattern or via a wiring frame and a wiring frame conductor pattern.

According to the foregoing electronic device 21 of the present invention, since a core board is not provided, reduction in thickness is enabled and it is possible to set a thickness thereof in the range of 25 to 400 μm. Further, since the electronic component incorporating layers 24A and 24B are provided in a stacked fashion, size reduction of the semiconductor device is enabled as compared with a case where electronic components are externally mounted. Further, since the flange portion 122 of the metal cap 121 is directly fixed to the metal frame body 26 of the uppermost-layer electronic component incorporating layer 24B with no resin adhesive interposed therebetween, falling off of the metal cap 121 due to temperature cycle is prevented and further the heat radiation effect through the metal cap 121 is achieved. Moreover, since the electronic component incorporating layers 24A and 24B are directly formed on the external terminal wiring layers 23 and the wiring layers 30b, respectively, i.e. the electronic component incorporating layers 24A and 24B are not prepared separately in advance and stacked, connection means such as an anisotropic conductive film, a conductive adhesive, or a conductive paste does not exist between the layers and therefore the electronic device 21 has high heat resistance and is thus excellent in reliability.

A material of the insulating resin layer 25 constituting each of the electronic component incorporating layers 24A and 24B can be the same as that of the insulating resin layer 5 constituting each of the electronic component incorporating layers 4A and 4B in the foregoing first embodiment. A material of the metal frame body 26 constituting each of the electronic component incorporating layers 24A and 24B, a material of the upper-lower side conducting vias 27, a material of the upper-lower side conducting vias 27a, 27b, and 27c, and a material of the wiring layers 30a, 30b, and 30c can be the same as that of the metal frame bodies, the upper-lower side conducting vias, and the wiring layers in the foregoing first or second embodiment. Further, a material of the electrically insulating layers 29a, 29b, and 29c can be the same as that of the electrically insulating layers in the foregoing first or second embodiment.

The shape of the metal frame body 26 is not particularly limited as long as it is formed to surround the upper-lower side conducting vias 27 and the electronic component 28, and can be suitably set to a ring shape, a corridor shape, or the like taking into account the shape of a metal cap to be used and so forth.

The external terminal wiring layers 23 each can be formed by using a conductive material such as copper, nickel, or gold.

In the foregoing embodiment, the electronic component incorporating layer 24A is provided therein with the metal frame body 26. However, the electronic component incorporating layer 24A is not necessarily provided with the metal frame body 26.

In the foregoing embodiment, the electronic component incorporating layer 24A is directly formed on the external terminal wiring layers 23. However, the electronic component incorporating layer 24A may be provided thereon via a desired electrically insulating layer and desired wiring layers interposed therebetween.

Fourth Embodiment of Electronic Device

Figure 4:
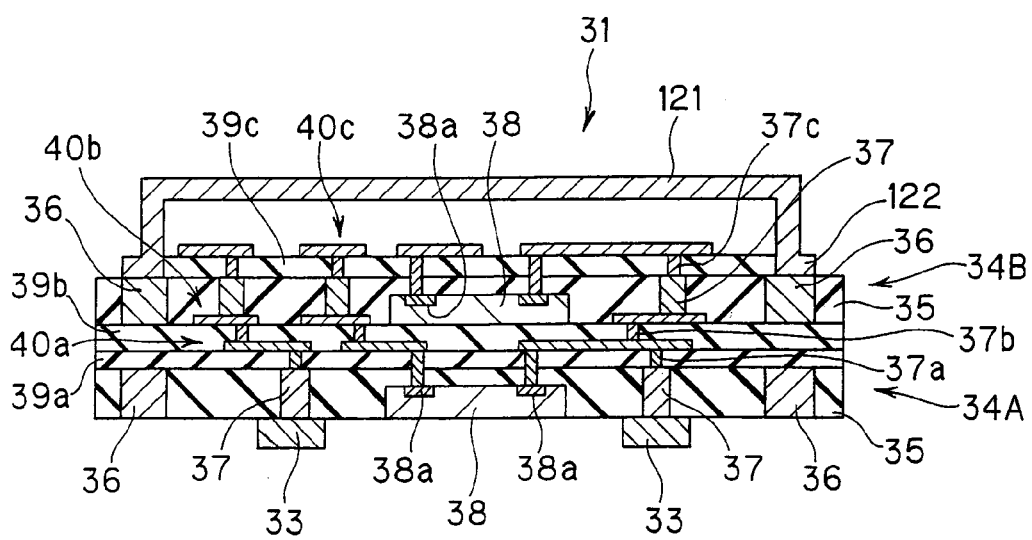
FIG. 4 is a schematic longitudinal sectional view showing a fourth preferred embodiment of an electronic device of the present invention.

FIG. 4 is a schematic longitudinal sectional view showing another embodiment of an electronic device of the present invention. In FIG. 4, an electronic device 31 of the present invention comprises a stacked or layered body having wiring layers, electrically insulating layers, and electronic component incorporating layers, external terminal wiring layers, and a metal cap.

In the electronic device 31, an electronic component incorporating layer 34A is formed on external terminal wiring layers 33. The electronic component incorporating layer 34A comprises an insulating resin layer 35, an electronic component 38 incorporated in the insulating resin layer 35, and upper-lower side conducting vias 37 and further comprises a metal frame body 36 disposed near a peripheral portion of the insulating resin layer 35 so as to surround the upper-lower side conducting vias 37 and the electronic component 38. The upper-lower side conducting vias 37 are connected to the corresponding predetermined external terminal wiring layers 33, respectively. In the illustrated example, the numbers of the external terminal wiring layers 33, the upper-lower side conducting vias 37, the electronic components 38, and the later-described wiring layers and electrically insulating layers are abbreviated for facilitating the description.

The electronic component incorporating layer 34A is a layer provided by placing the electronic component 38 on the external terminal wiring layers 33 and directly forming the insulating resin layer 35 having the metal frame body 36 and the upper-lower side conducting vias 37 on the external terminal wiring layers 33 so as to incorporate the electronic component 38 therein. Note that "on the external terminal wiring layers 33" as mentioned above is a concept including "on a metal conductive layer to be formed into the external terminal wiring layers 33". The electronic component 38 may be in the form of one kind or more of LSI chip, IC chip, LCR electronic component, and sensor component, and a plurality of electronic components 38 may be incorporated.

On the electronic component incorporating layer 34A, first-layer wiring layers 40a are formed via a first-layer electrically insulating layer 39a so as to be connected to the upper-lower side conducting vias 37 and terminal portions 38a of the electronic component 38 of the electronic component incorporating layer 34A by the use of upper-lower side conducting vias 37a. Further, on the first-layer wiring layers 40a, second-layer wiring layers 40b are formed via a second-layer electrically insulating layer 39b so as to be connected to the predetermined first-layer wiring layers 40a by the use of upper-lower side conducting vias 37b, respectively. Wiring layers may further be stacked depending on necessity.

An electronic component incorporating layer 34B is formed on the second-layer wiring layers 40b. Like the electronic component incorporating layer 34A, the electronic component incorporating layer 34B also comprises an insulating resin layer 35, an electronic component 38 incorporated in the insulating resin layer 35, and upper-lower side conducting vias 37 and further comprises a metal frame body 36 disposed near a peripheral portion of the insulating resin layer 35 so as to surround the upper-lower side conducting vias 37 and the electronic component 38.

The upper-lower side conducting vias 37 are connected to the predetermined second-layer wiring layers 40b, respectively. The electronic component incorporating layer 34B is a layer provided by placing the electronic component 38 on the second-layer wiring layers 40b and directly forming the insulating resin layer 35 having the upper-lower side conducting vias 37 and the metal frame body 36 disposed surrounding them, on the wiring layers 40b so as to incorporate the electronic component 38 therein. Note that the electronic component 38 may be in the form of one kind or more of LSI chip, IC chip, LCR electronic component, and sensor component, and a plurality of electronic components 38 may be incorporated, and further, it may differ from the electronic component 38 incorporated in the electronic component incorporating layer 34A.

The electronic component incorporating layer 34B is an uppermost-layer electronic component incorporating layer in the electronic device 31 of the illustrated example. On the electronic component incorporating layer 34B, third-layer wiring layers 40c are formed via a third-layer electrically insulating layer 39c so as to be connected to the upper-lower side conducting vias 37 and terminal portions 38a of the electronic component 38 of the electronic component incorporating layer 34B by the use of upper-lower side conducting vias 37c. Further, a flange portion 122 of a metal cap 121 is directly fixed to the metal frame body 36 of the electronic component incorporating layer 34B.

It may be configured that, like in the foregoing second embodiment, the flange portion 122 of the metal cap 121 is fixed to the metal frame body 36 of the electronic component incorporating layer 34B via a wiring frame conductor pattern or via a wiring frame and a wiring frame conductor pattern.

According to the foregoing electronic device 31 of the present invention, since a core board is not provided, reduction in thickness is enabled and it is possible to set a thickness thereof in the range of 25 to 400 µm. Further, since the electronic component incorporating layers 34A and 34B are provided in a stacked fashion, size reduction of the electronic device is enabled as compared with a case where electronic components are externally mounted. Further, since the flange portion 122 of the metal cap 121 is directly fixed to the metal frame body 36 of the uppermost-layer electronic component incorporating layer 34B with no resin adhesive interposed therebetween, falling off of the metal cap 121 due to temperature cycle is prevented and further the heat radiation effect through the metal cap 121 is achieved. Moreover, since the electronic component incorporating layers 34A and 34B are directly formed on the external terminal wiring layers 33 and the wiring layers 40b, respectively, i.e. the electronic component incorporating layers 34A and 34B are not prepared separately in advance and stacked, connection means such as an anisotropic conductive film, a conductive adhesive, or a conductive paste does not exist between the layers and therefore the electronic device 31 has high heat resistance and is thus excellent in reliability.

A material of the insulating resin layer 35 constituting each of the electronic component incorporating layers 34A and 34B can be the same as that of the insulating resin layer 5 constituting each of the electronic component incorporating layers 4A and 4B in the foregoing first embodiment. A material of the metal frame body 36 constituting each of the electronic component incorporating layers 34A and 34B, a material of the upper-lower side conducting vias 37, a material of the upper-lower side conducting vias 37a, 37b, and 37c, and a material of the wiring layers 40a, 40b, and 40c can be the same as that of the metal frame bodies, the upper-lower side conducting vias, and the wiring layers in the foregoing first embodiment. Further, a material of the electrically insulating layers 39a, 39b, and 39c can be the same as that of the electrically insulating layers in the foregoing first embodiment.

The shape of the metal frame body 36 is not particularly limited as long as it is formed to surround the upper-lower side conducting vias 37 and the electronic component 38, and can be suitably set to a ring shape, a corridor shape, or the like taking into account the shape of a metal cap to be used and so forth.

The external terminal wiring layers 33 each can be formed by using a conductive material such as copper, nickel, or gold.

In the foregoing embodiment, the electronic component incorporating layer 34A is provided therein with the metal frame body 36. However, the electronic component incorporating layer 34A is not necessarily provided with the metal frame body 36.

In the foregoing embodiment, the electronic component incorporating layer 34A is directly formed on the external terminal wiring layers 33. However, the electronic component incorporating layer 34A may be provided thereon via a desired electrically insulating layer and desired wiring layers interposed therebetween.

The electronic device of the present invention is not limited to those shown in the foregoing first to fourth embodiments, and there is no limit to the stacking number of wiring layers, electrically insulating layers, and electronic component incorporating layers to be formed.

Further, in the electronic device of the present invention, input/output terminals can be provided outside the metal cap. Moreover, such terminal pads each may have a solder layer formed on the surface thereof.

Production method of Electronic Device

Now, electronic device production methods of the present invention will be described with reference to the drawings.

First Embodiment of Production Method

FIGS. 5A to 5D, FIGS. 6A to 6C, FIGS. 7A to 7C, and FIGS. 8A to 8C are process diagrams for describing one embodiment of a production method of an electronic device according to the present invention, wherein the electronic device 1 shown in FIG. 1 is used as an example.

In the production method of the electronic device according to the present invention, a power feed layer 51 is first formed on the side of one surface 2a of a core board 2, then a plating mask 52 is formed on the power feed layer 51 (FIG. 5A). The power feed layer 51 can be obtained by forming a conductive thin film of chromium, titanium, chromium/copper, titanium/copper, or the like by the use of the vacuum film forming method or the like. On the other hand, the plating mask 52 can be formed by, for example, laminating a dry film resist onto the power feed layer 51 and carrying out desired patterning exposure and development. The plating mask 52 has opening portions 52a at positions where later-described conductive columnar convex portions 57 will be formed, an opening portion 52b at a position where a later-described block body 58 will be formed, and further, a continuous opening portion 52c at a position where a later-described frame body 56 will be formed so as to surround the opening portions 52a and 52b. The thickness of the plating mask 52 determines the height of the frame body 56, the height of each conductive columnar convex portion 57, and the thickness of the block body 58 and can be suitably set in the range of, for example, 25 to 400 µm.

Figure 9:
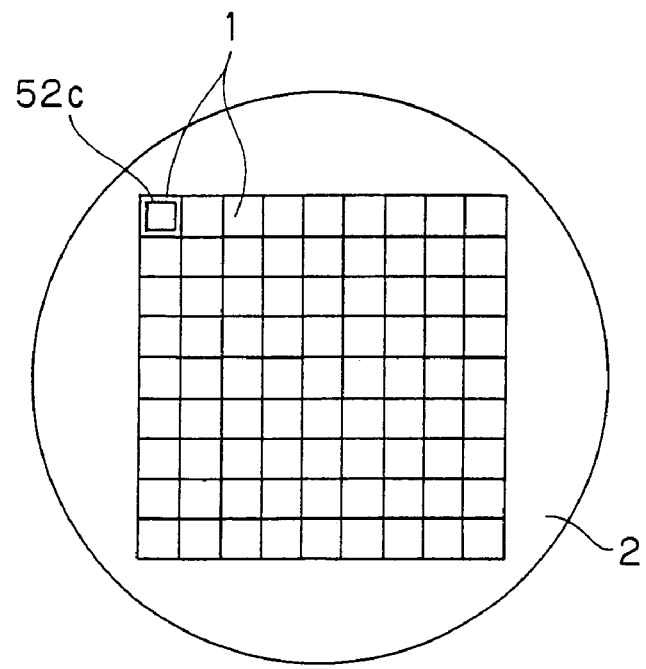
FIG. 9 is a diagram for explaining panelization and a position of each of frame bodies in a production method of electronic devices according to the present invention.

Herein, when producing the electronic devices 1, one shown in FIG. 1, by panelization, the opening portion 52c for forming the frame body 56 is formed on each of panels as seen from FIG. 9. As appreciated, in FIG. 9, the opening portion 52c is illustrated on only one of the panels of the panelization. Note, however, that even in the case where the opening portion 52c is formed per panel, when the frame body is not finally required to remain in an electronic device as different from the electronic device 1, the opening portion 52c is formed in a border region of each panel.

Figure 10:
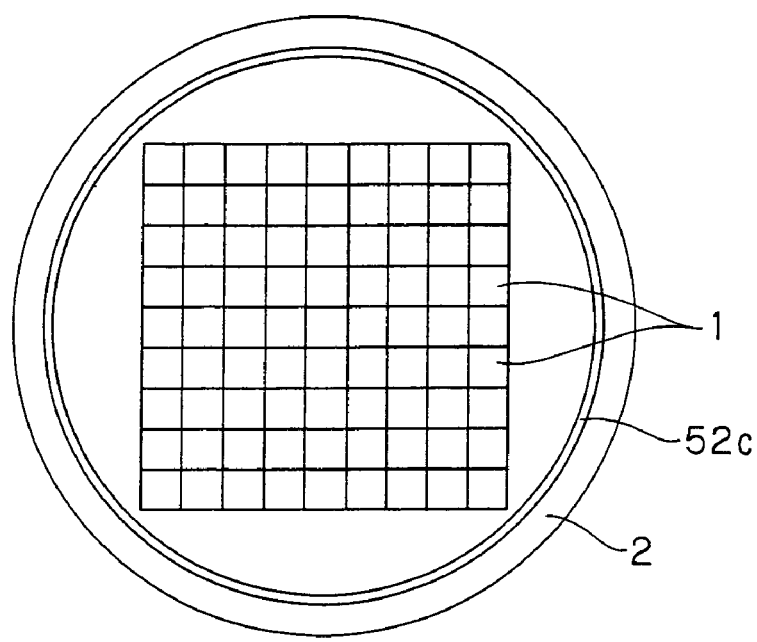
FIG. 10 is a diagram for explaining panelization and a position of a frame body in a production method of electronic devices according to the present invention.

In the electronic device production method of the present invention, as shown in FIG. 10, an opening portion 52c for forming a frame body 56 may be formed at a position surrounding all the panels. In this case, however, it is impossible to produce the electronic device having the metal frame body 6 shown in FIG. 1, but, as will be described later, a remarkable effect is exhibited by the frame body in the production process. Although, in FIG. 10, the opening portion 52c having a ring shape is formed so as to surround all the panels, there is no particular limit to the shape of the opening portion 52c.

Then, a metal material is deposited on the power feed layer 51 by electrolytic plating via the plating mask 52, then the plating mask 52 is removed, so that there are formed the conductive columnar convex portions 57 for upper-lower side conducting vias, the block body 58 for forming a cutout portion for receiving an electronic component therein, and the frame body 56 surrounding them (FIG. 5B). Each conductive columnar convex portion 57 is located on a conductive material 3 of the core board 2, and the block body 58 is located on the core board 2 at a predetermined position other than positions of through holes 2c. When the frame body 56 is left in each of electronic devices produced by panelization, it is formed at a position that finally falls within the electronic device, while, when not required to remain in each electronic device, it is formed in a border region (a region to be removed in a process prior to completion of a final product) of each panel. In this embodiment, description will be given about a case where the frame body 56 remains in each electronic device.

The frame body 56, the conductive columnar convex portions 57, and the block body 58 formed by the electrolytic plating may be made of a metal material such as copper, silver, gold, chromium, or aluminum. It is preferable that the material of them be selected in consideration of the material of the power feed layer 51 so as to enable below-described removal of the power feed layer 51.

Then, the exposed power feed layer 51 is removed (FIG. 5C). This removal of the power feed layer 51 can be carried out by wet etching, dry etching, or the like using the frame body 56, the conductive columnar convex portions 57, and the block body 58 as a mask.

Then, an insulating resin layer 5 is formed so as to cover the conductive columnar convex portions 57 and the block body 58 surrounded by the frame body 56, and thereafter, the insulating resin layer 5 is polished so as to expose only top portions of the frame body 56 and the conductive columnar convex portions 57 and only an upper surface of the block body 58 (FIG. 5D). This makes the conductive columnar convex portions 57 become upper-lower side conducting vias 7. The formation of the insulating resin layer 5 can be achieved by applying an application liquid containing an electrically insulating resin such as an epoxy resin, a polyimide resin, or the like by the use of a known application method and then performing a predetermined curing process such as heating, ultraviolet irradiation, or electron beam irradiation. In the present invention, owing to the existence of the frame body 56, the formation of the insulating resin layer 5 having a sufficient thickness is facilitated. Even when the frame body 56 is formed at the position surrounding all the panels as shown in FIG. 10, it is possible to uniformly and easily form a thick insulating resin layer 5 of several hundreds of micrometers by the potting method and the doctor blade method using the frame body 56 without being affected by the viscosity of the application liquid for formation of the insulating resin layer 5.

Figure 6A:
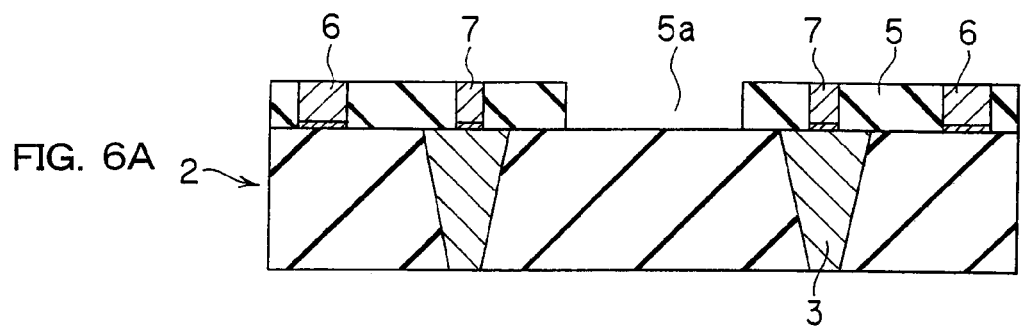
FIGS. 6A to 6C are process diagrams showing the first embodiment of the production method of the electronic device according to the present invention.

Then, the block body 58 is removed to thereby form a cutout portion 5a in the insulating resin layer 5 (FIG. 6A). The removal of the block body 58 can be achieved by, for example, forming on the insulating resin layer 5 a resist pattern that exposes only the block body 58, then removing only the block body 58 by etching or the like, and then removing the resist pattern. When the power feed layer 51 remains in the cutout portion 5a after the removal of the block body 58, it is removed.

Figure 6B:
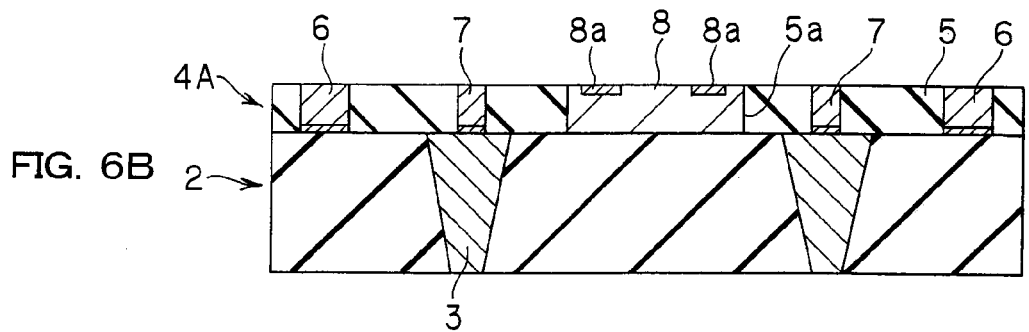

Thereafter, an electronic component 8 is fitted into the cutout portion 5a to thereby form an electronic component incorporating layer 4A (FIG. 6B). The electronic component 8 may be fixed in the cutout portion 5a (on the core board 2) by the use of a conductive or insulating adhesive with high heat resistance such as ABLEBOND 3230 (trade name).

Figure 6C:
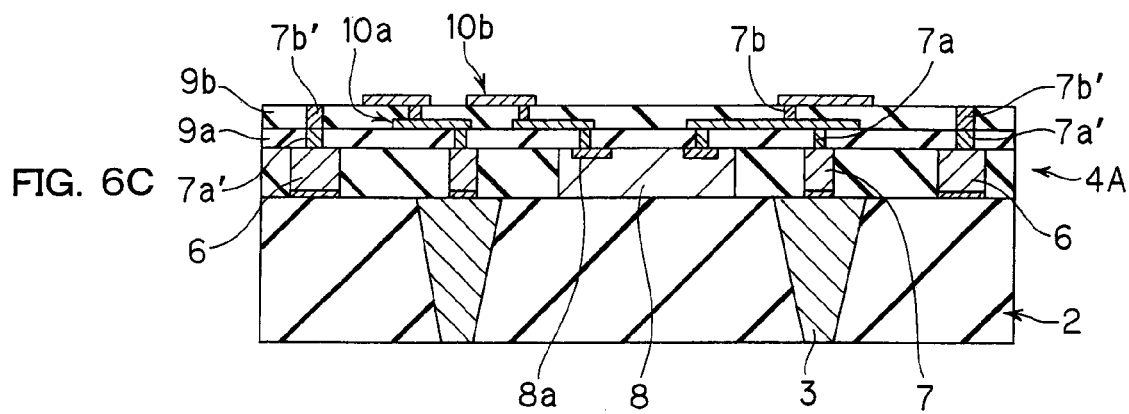

Then, respective wiring layers 10a and 10b are formed via electrically insulating layers 9a and 9b so as to cover the electronic component incorporating layer 4A and wiring frames 7a' and 7b' are formed on the frame body 6 (FIG. 6C). The formation of the electrically insulating layer 9a having upper-lower side conducting vias 7a and the wiring layers 10a and the formation of the wiring frame 7a' can be carried out, for example, in the following manner. First, the photosensitive electrically insulating layer 9a is formed so as to cover the electronic component incorporating layer 4A. This electrically insulating layer 9a is exposed via a predetermined mask and developed so that small-diameter holes are formed at predetermined positions of the electrically insulating layer 9a so as to expose the upper-lower side conducting vias 7, terminal portions 8a of the electronic component 8, and the frame body 6 of the electronic component incorporating layer 4A. Then, after cleaning, a conductive layer is formed in the holes and on the electrically insulating layer 9a by the vacuum film forming method, then a resist layer is formed on the conductive layer and, by carrying out desired patterning exposure and development, a resist pattern is formed. Thereafter, using this resist pattern as a mask, a conductive material is deposited at exposed portions including the foregoing holes by electrolytic plating to thereby form the upper-lower side conducting vias 7a, the wiring frame 7a', and the wiring layers 10a, then the resist pattern and the conductive layer are removed.

On the other hand, the formation of the electrically insulating layer 9a having upper-lower side conducting vias 7a and the wiring layers 10a and the formation of the wiring frame 7a' can also be carried out in the following manner. Specifically, the electrically insulating layer 9a is formed so as to cover the electronic component incorporating layer 4A. Using a carbon dioxide laser, a UV-YAG laser, or the like, small-diameter holes are formed at predetermined positions of the electrically insulating layer 9a so as to expose the upper-lower side conducting vias 7, terminal portions 8a of the electronic component 8, and the frame body 6 of the electronic component incorporating layer 4A. Then, after cleaning, a conductive layer is formed in the holes and on the electrically insulating layer 9a by electroless plating, then a dry film resist is laminated onto the conductive layer and, by carrying out desired patterning exposure and development, a resist pattern is formed. Thereafter, using this resist pattern as a mask, a conductive material is deposited at exposed portions including the foregoing holes by electrolytic plating to thereby form the upper-lower side conducting vias 7a, the wiring frame 7a', and the wiring layers 10a, then the resist pattern and the conductive layer are removed.

As the conductive material, there can be cited copper, silver, gold, aluminum, or the like. Like in the foregoing manner, the electrically insulating layer 9b having upper-lower side conducting vias 7b, the wiring layers 10b, and the wiring frame 7b' can be formed.

Figure 7A:
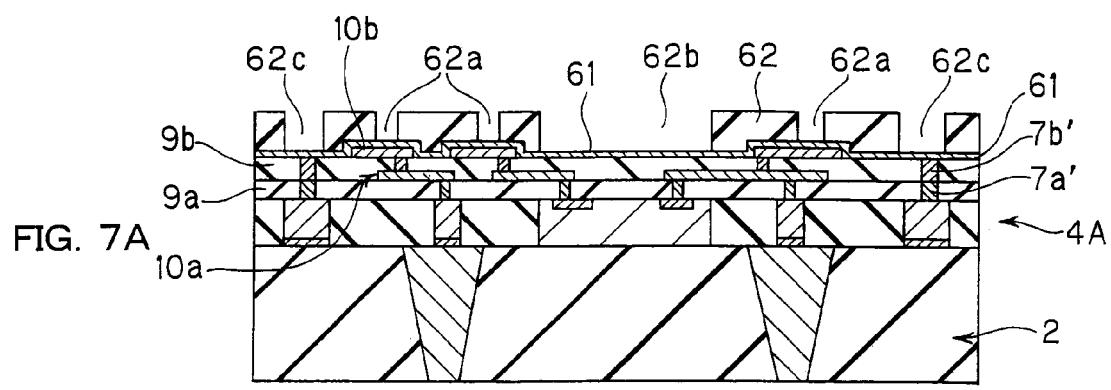
FIGS. 7A to 7C are process diagrams showing the first embodiment of the production method of the electronic device according to the present invention.

Then, a second-layer (uppermost-layer) electronic component incorporating layer 4B is formed. Also in this event, a power feed layer 61 is first formed on the electrically insulating layer 9b and the wiring layers 10b, then a plating mask 62 is formed on the power feed layer 61 (FIG. 7A). The power feed layer 61 can be formed in the same manner as the foregoing power feed layer 51. Further, the plating mask 62 can also be formed in the same manner as the foregoing plating mask 52. The plating mask 62 has opening portions 62a at positions where later-described conductive columnar convex portions 67 will be formed, an opening portion 62b at a position where a later-described block body 68 will be formed, and further, a continuous opening portion 62c at a position where a later-described frame body 66 will be formed so as to surround the opening portions 62a and 62b. The thickness of the plating mask 62 determines the height of the frame body 66, the height of each conductive columnar convex portion 67, and the thickness of the block body 68 and can be suitably set in the range of, for example, 25 to 400 μm.

Figure 7B:
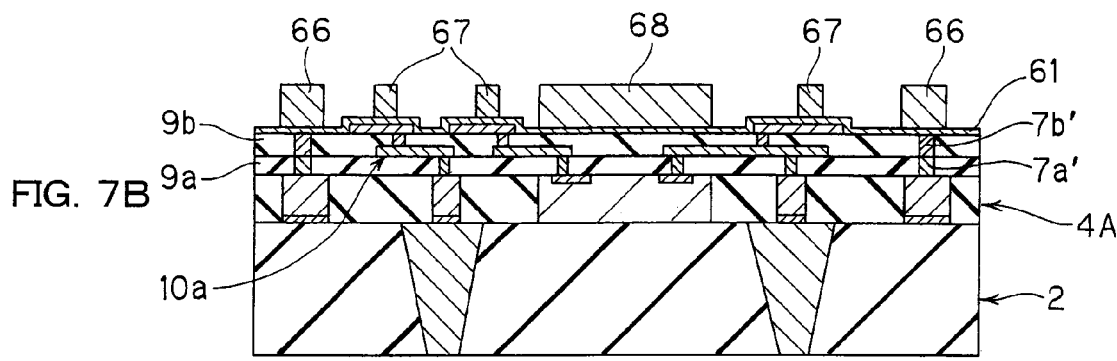

Then, a metal material is deposited on the power feed layer 61 by electrolytic plating via the plating mask 62, then the plating mask 62 is removed, so that there are formed the conductive columnar convex portions 67 for upper-lower side conducting vias, the block body 68 for forming a cutout portion for receiving an electronic component therein, and the frame body 66 surrounding them (FIG. 7B). Each conductive columnar convex portion 67 is located at a predetermined position on the corresponding wiring layer 10b being a lower layer, the block body 68 is located at a predetermined position on the electrically insulating layer 9b, and the frame body 66 is located on the wiring frame 7b'. When producing the foregoing electronic device of the present invention having the metal cap, the frame body 66 is formed at a position that finally falls within the electronic device.

This formation of the frame body 66, the conductive columnar convex portions 67, and the block body 68 by the electrolytic plating can be carried out in the same manner as the foregoing formation of the frame body 56, the conductive columnar convex portions 57, and the block body 58 by the electrolytic plating.

Figure 7C:
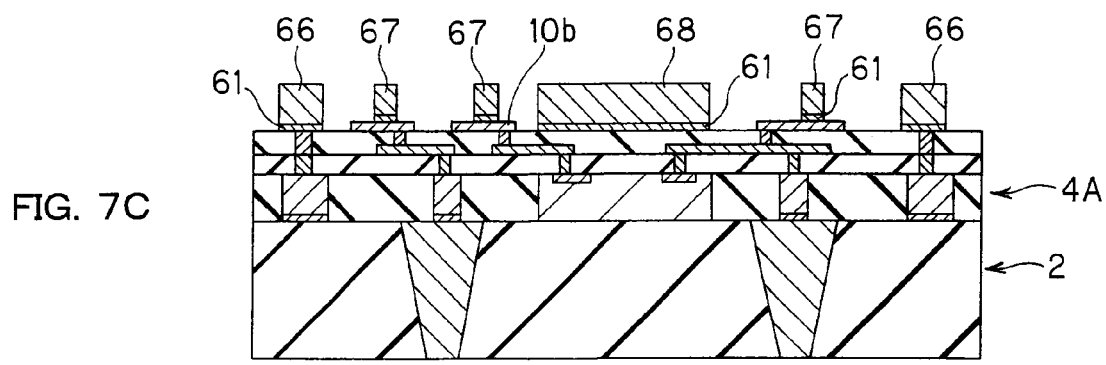
Figure 8A:
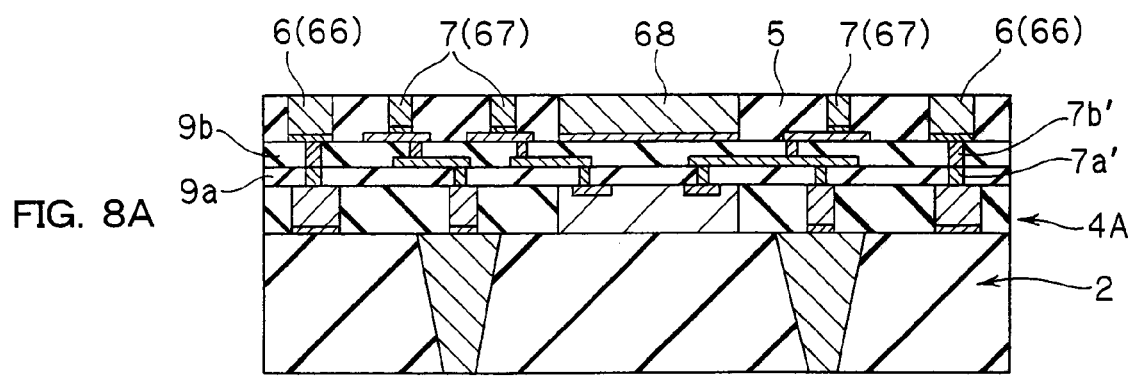
FIGS. 8A to 8C are process diagrams showing the first embodiment of the production method of the electronic device according to the present invention.

Subsequently, the exposed power feed layer 61 is removed (FIG. 7C). Then, an insulating resin layer 5 is formed so as to cover the conductive columnar convex portions 67 and the block body 68 surrounded by the frame body 66, and thereafter, the insulating resin layer 5 is polished so as to expose only top portions of the frame body 66 and the conductive columnar convex portions 67 and only an upper surface of the block body 68 (FIG. 8A). This makes the conductive columnar convex portions 67 become upper-lower side conducting vias 7. The formation of the insulating resin layer 5 can be carried out in the same manner as the foregoing formation of the insulating resin layer 5. In the present invention, owing to the existence of the frame body 66, the formation of the insulating resin layer 5 having a sufficient thickness is facilitated. Even when the frame body 66 is formed at the position surrounding all the panels as shown in FIG. 10, it is possible to uniformly and easily form a thick insulating resin layer 5 of several hundreds of micrometers by the potting method and the doctor blade method using the frame body 66 without being affected by the viscosity of the application liquid for formation of the insulating resin layer 5.

Figure 8B:
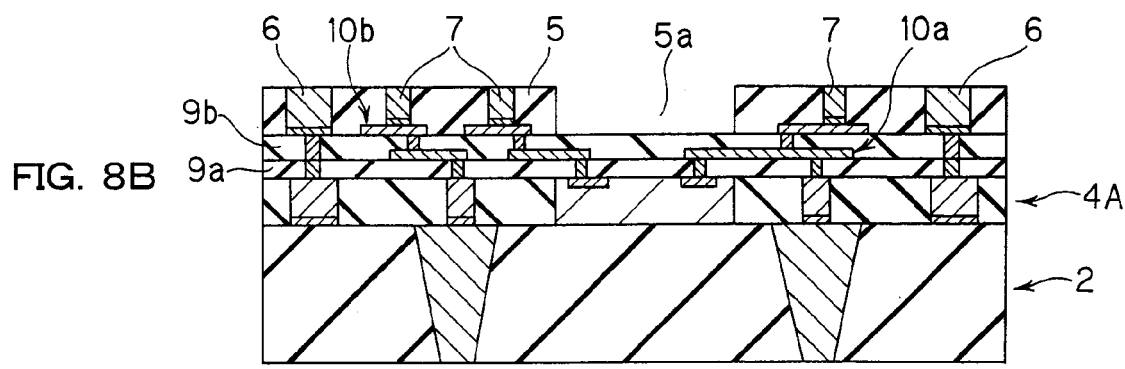

Then, the block body 68 is removed to thereby form a cutout portion 5a in the insulating resin layer 5 (FIG. 8B). When the power feed layer 61 remains in the cutout portion 5a after the removal of the block body 68, it is removed.

Figure 8C:
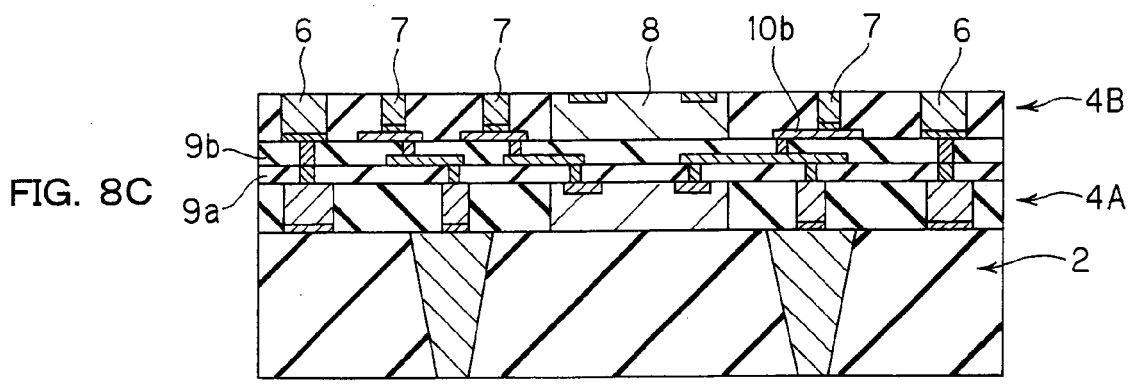

Thereafter, an electronic component 8 is fitted into the cutout portion 5a to thereby form an electronic component incorporating layer 4B (FIG. 8C). The electronic component 8 may be fixed in the cutout portion 5a by the use of a conductive or insulating adhesive with high heat resistance such as ABLEBOND 3230 (trade name).

Then, wiring layers 10c are formed via an electrically insulating layer 9c (not illustrated) so as to cover the electronic component incorporating layer 4B and a metal cap is fixed to the metal frame body 6 existing in the uppermost-layer electronic component incorporating layer 4B, so that the electronic device as shown in FIG. 1 can be obtained. The formation of the electrically insulating layer 9c having upper-lower side conducting vias 7c and the wiring layers 10c can be carried out in the same manner as the foregoing formation of the electrically insulating layer 9a having the upper-lower side conducting vias 7a and the wiring layers 10a. The fixation of a flange portion of the metal cap to the metal frame body 6 can be carried out by brazing, welding, soldering, or the like.

When, as described above, the electronic device 1 is configured such that, like the electronic device 11 being the second embodiment, the flange portion 122 of the metal cap 121 is fixed to the metal frame body 6 of the electronic component incorporating layer 4B via the third-layer wiring frame and the wiring frame conductor pattern, the wiring layers 10c and the wiring frame conductor pattern are formed via the electrically insulating layer 9c having the upper-lower side conducting vias 7c and the wiring frame so as to cover the electronic component incorporating layer 4B.

Second Embodiment of Production Method

FIGS. 11A to 11C and FIGS. 12A and 12B are process diagrams for describing another embodiment of a production method of an electronic device according to the present invention, wherein the electronic device 11 shown in FIG. 2 is used as an example.

Figure 11A:
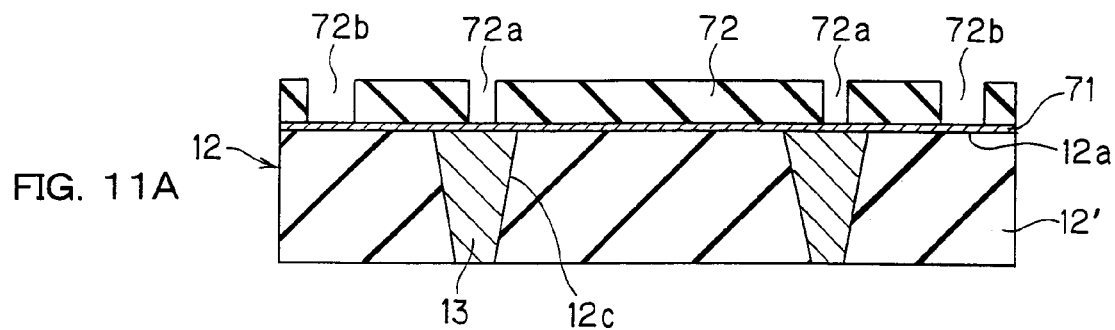
FIGS. 11A to 11C are process diagrams showing a second preferred embodiment of a production method of the electronic device according to the present invention.

In the production method of the electronic device according to the present invention, a power feed layer 71 is first formed on the side of one surface 12a of a core board 12, then a plating mask 72 is formed on the power feed layer 71 (FIG. 11A). The power feed layer 71 can be obtained by forming a conductive thin film of chromium, titanium, or the like by the use of the vacuum film forming method or the like. On the other hand, the plating mask 72 can be formed by, for example, laminating a dry film resist onto the power feed layer 71 and carrying out desired patterning exposure and development. The plating mask 72 has opening portions 72a at positions where later-described conductive columnar convex portions 77 will be formed, and a continuous opening portion 72b at a position where a later-described frame body 76 will be formed so as to surround the opening portions 72a. The thickness of the plating mask 72 determines the height of the frame body 76 and the height of each conductive columnar convex portion 77, and can be set such that, for example, the height of the frame body 76 and each conductive columnar convex portion 77 is greater than the thickness of an electronic component 18 to be incorporated by about 10 μm, and suitably set in the range of, for example, 30 to 400 μm.

When producing the electronic devices 11, one shown in FIG. 2, by panelization, the opening portion 72b for forming the frame body 76 may be formed at a position surrounding all the panels or on each of the panels, like in the foregoing embodiment. In this embodiment, the case is shown where the opening portion 72b is formed on each of the panels.

Figure 11B:
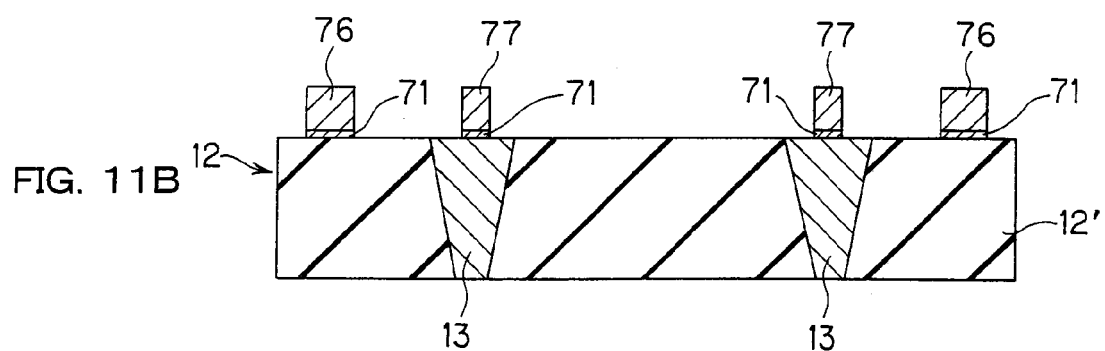

Then, a metal material is deposited on the power feed layer 71 by electrolytic plating via the plating mask 72, then the plating mask 72 is removed, so that there are formed the conductive columnar convex portions 77 for upper-lower side conducting vias, and the frame body 76 surrounding them (FIG. 11B). When the metal material deposited on the power feed layer 71 protrudes from the plating mask 72, it may be arranged to first polish only this protruding portion of the metal material to obtain a desired height of the metal material and then remove the plating mask 72.

On the other hand, the following method may be used for forming the conductive columnar convex portions 77 shown in FIG. 11B. Specifically, a thick copper layer is provided on the side of the surface 12a of the core board 12 by plating or pasting, then a mask is formed on the copper layer using a photoresist, and then the copper layer is etched by wet etching, thereby forming the conductive columnar convex portions 77 shown in FIG. 11B.

Each conductive columnar convex portion 77 thus formed is located on a conductive material 13 of the core board 12. When the frame body 76 is left in each of electronic devices produced by panelization, it is formed at a position that finally falls within the electronic device, while, when not required to remain in each electronic device, it is formed in a border region of each panel. In this embodiment, description will be given about a case where the frame body 76 remains in each electronic device.

The frame body 76 and the conductive columnar convex portions 77 formed by the electrolytic plating can be formed using the same material as the frame body 56 and the conductive columnar convex portions 57 in the foregoing embodiment.

Figure 11C:
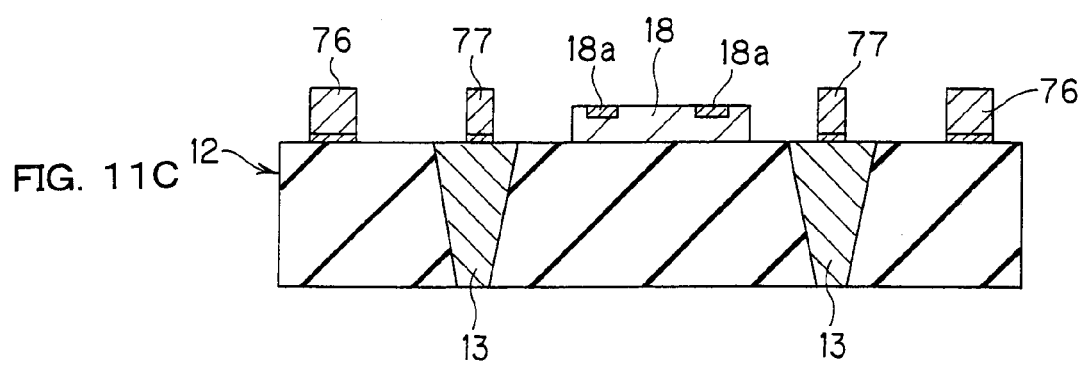

Then, the exposed power feed layer 71 is removed and the electronic component 18 is placed on the surface 12a of the core board 12 (FIG. 11C). The removal of the power feed layer 71 can be carried out by wet etching, dry etching, or the like using the frame body 76 and the conductive columnar convex portions 77 as a mask. The electronic component 18 may be fixed on the core board 12 by the use of a conductive or insulating adhesive with high heat resistance such as ABLEBOND 3230 (trade name).

Figure 12A:
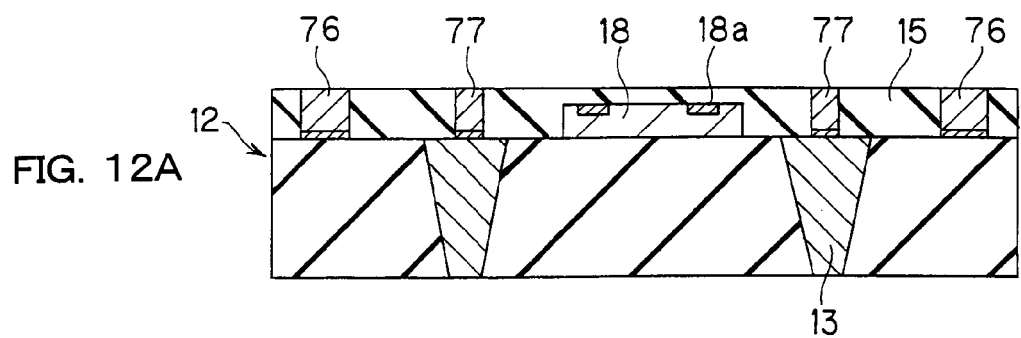
FIGS. 12A and 12B are process diagrams showing the second embodiment of the production method of the electronic device according to the present invention.
Figure 12B:
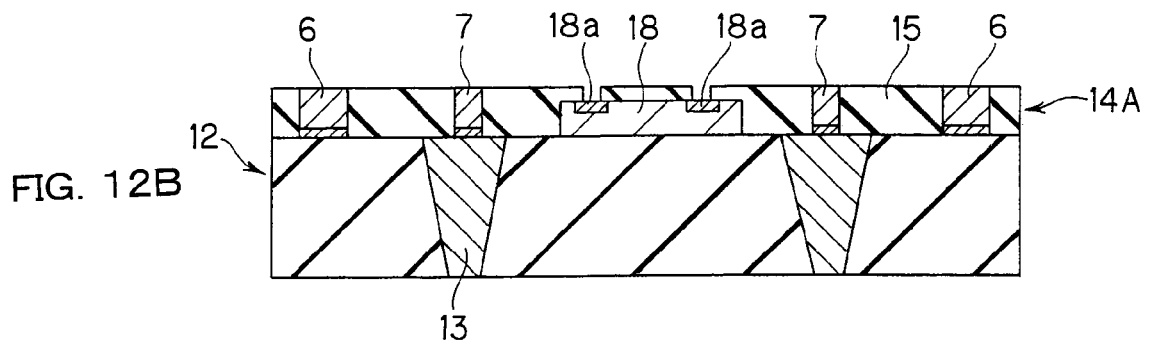

Then, a photosensitive insulating resin layer 15 is formed so as to cover the electronic component 18 and the conductive columnar convex portions 77 surrounded by the frame body 76, and the insulating resin layer 15 is polished so as to expose top portions of the frame body 76 and the conductive columnar convex portions 77 (FIG. 12A). Thereafter, the insulating resin layer 15 is exposed in a predetermined pattern and developed to thereby expose terminal portions 18a of the electronic component 18 (FIG. 12B). This makes the conductive columnar convex portions 77 become upper-lower side conducting vias 17, thereby forming an electronic component incorporating layer 14A. Instead of polishing the photosensitive insulating resin layer 15 after the formation thereof so as to cover the electronic component 18 and the conductive columnar convex portions 77 as described above, the terminal portions 18a of the electronic component 18 and the top portions of the frame body 76 and the conductive columnar convex portions 77 as well may be exposed by the exposure and development carried out thereafter.

The formation of the insulating resin layer 15 can be achieved by applying an application liquid containing a combination of an electrically insulating resin material such as a photosensitive epoxy resin, benzocyclobutene resin, cardo resin or polyimide resin and glass fibers or the like by the use of a known application method, then exposing it by the use of ultraviolet irradiation, electron beam irradiation, or the like, and then developing it. In the present invention, owing to the existence of the frame body 76, the formation of the insulating resin layer 15 having a sufficient thickness is facilitated. Even when the frame body 76 is formed at the position surrounding all the panels, it is possible to uniformly and easily form a thick insulating resin layer 15 of several hundreds of micrometers by the potting method and the doctor blade method using the frame body 76 without being affected by the viscosity of the application liquid for formation of the insulating resin layer 15.

Then, respective wiring layers 20a and 20b are formed via electrically insulating layers 19a and 19b so as to cover the electronic component incorporating layer 14A, and an electronic component incorporating layer 14B is formed on the wiring layers 20b (not illustrated) by the same processes as shown in FIGS. 11A to 12B. Further, wiring layers 20c and a wiring frame conductor pattern 20c' are formed via an electrically insulating layer 19c having upper-lower side conducting vias 17c and a wiring frame 17c' so as to cover the electronic component incorporating layer 14B (not illustrated). Then, a metal cap is fixed to the metal frame body 16 existing in the uppermost-layer electronic component incorporating layer 14B via the wiring frame 17c' and the wiring frame conductor pattern 20c', so that the electronic device as shown in FIG. 2 can be obtained. The formation of the electrically insulating layers 19a, 19b, and 19c having the upper-lower side conducting vias 17a, 17b, and 17c and the wiring frames 17a', 17b', and 17c', respectively, the wiring layers 20a, 20b, and 20c, and the wiring frame conductor pattern 20c' can be carried out in the same manner as the formation of the electrically insulating layer 9a having the upper-lower side conducting vias 7a and the wiring frame 7a', and the wiring layers 10a in the foregoing embodiment. Further, the fixation of a flange portion of the metal cap can also be carried out in the same manner as in the foregoing embodiment.

Third Embodiment of Production Method

FIGS. 13A to 13D, FIGS. 14A to 14D, and FIGS. 15A to 15D are process diagrams for describing another embodiment of a production method of an electronic device according to the present invention, wherein the electronic device 21 shown in FIG. 3 is used as an example.

Figure 13A:
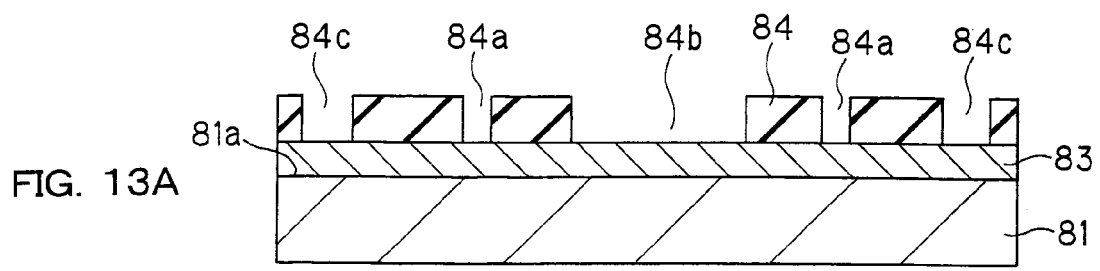
FIGS. 13A to 13D are process diagrams showing a third preferred embodiment of a production method of the electronic device according to the present invention.

In the production method of the electronic device according to the present invention, a metal conductive layer 83 is first formed on one surface 81a of a base member 81 and a plating mask 84 is formed on the metal conductive layer 83 (FIG. 13A).

For the base member 81, use can be made of a material having a thermal expansion coefficient in XY directions (the plane parallel to the surface 81a of the base member 81) falling within the range of 2 to 20 ppm, preferably 2.5 to 17 ppm, for example, silicon, glass, or a 42 alloy (iron/nickel alloy). The thickness of the base member 81 can be suitably set in the range of, for example, about 0.1 to 1 mm. On the other hand, the metal conductive layer 83 will be patterned to become external terminal wiring in a later-described process and can be made of a material such as copper, nickel, gold, or aluminum. This metal conductive layer 83 can be formed by vacuum film formation, plating, printing, or the like, and the thickness thereof can be suitably set in the range of, for example, about 0.1 to 15 μm.

On the other hand, the plating mask 84 can be formed by, for example, laminating a dry film resist onto the metal conductive layer 83 and carrying out desired patterning exposure and development. The plating mask 84 has opening portions 84a at positions where later-described conductive columnar convex portions 87 will be formed, an opening portion 84b at a position where a later-described block body 88 will be formed, and further, a continuous opening portion 84c at a position where a later-described frame body 86 will be formed so as to surround the opening portions 84a and 84b. The thickness of the plating mask 84 determines the height of the frame body 86, the height of each conductive columnar convex portion 87, and the thickness of the block body 88 and can be suitably set in the range of, for example, 25 to 400 μm.

When producing the electronic devices 21, one shown in FIG. 3, by panelization, the opening portion 84c for forming the frame body 86 may be formed at a position surrounding all the panels or on each of the panels. In this embodiment, the case is shown where the opening portion 84c is formed on each of the panels.

Figure 13B:
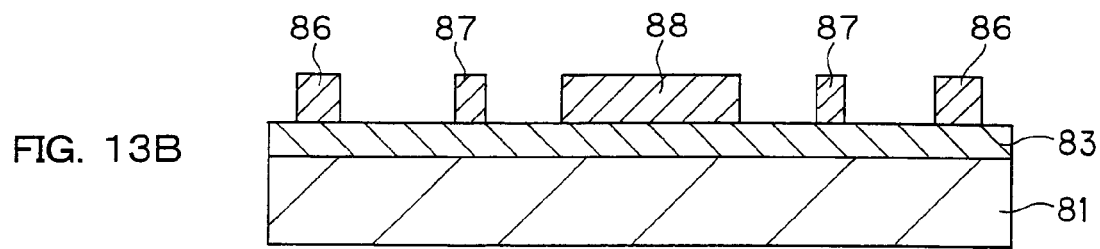

Then, a metal material is deposited on the metal conductive layer 83 by electrolytic plating via the plating mask 84, then the plating mask 84 is removed, so that there are formed the conductive columnar convex portions 87 for upper-lower side conducting vias, the block body 88 for forming a cutout portion for receiving an electronic component therein, and the frame body 86 surrounding them (FIG. 13B). When the frame body 86 is left in each of electronic devices produced by panelization, it is formed at a position that finally falls within the electronic device, while, when not required to remain in each electronic device, it is formed in a border region of each panel. In this embodiment, description will be given about a case where the frame body 86 remains in each electronic device.

The frame body 86, the conductive columnar convex portions 87, and the block body 88 formed by the electrolytic plating can be made of a metal material such as copper, silver, gold, chromium, or aluminum.

Figure 13C:
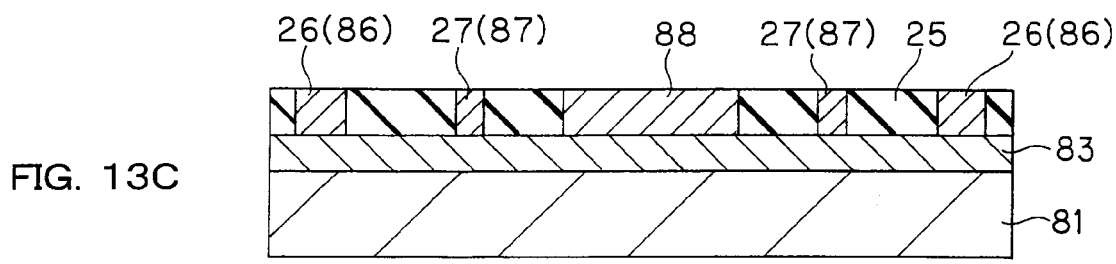

Then, an insulating resin layer 25 is formed so as to cover the conductive columnar convex portions 87 and the block body 88 surrounded by the frame body 86, and thereafter, the insulating resin layer 25 is polished so as to expose only top portions of the frame body 86 and the conductive columnar convex portions 87 and only an upper surface of the block body 88 (FIG. 13C). This makes the conductive columnar convex portions 87 become upper-lower side conducting vias 27. The formation of the insulating resin layer 25 can be achieved by applying an application liquid containing an electrically insulating resin such as an epoxy resin, a polyimide resin, or the like by the use of a known application method and then performing a predetermined curing process such as heating, ultraviolet irradiation, or electron beam irradiation. In the present invention, owing to the existence of the frame body 86, the formation of the insulating resin layer 25 having a sufficient thickness is facilitated. Even when the frame body 86 is formed at the position surrounding all the panels, it is possible to uniformly and easily form a thick insulating resin layer 25 of several hundreds of micrometers by the potting method and the doctor blade method using the frame body 86 without being affected by the viscosity of the application liquid for formation of the insulating resin layer 25.

Figure 13D:
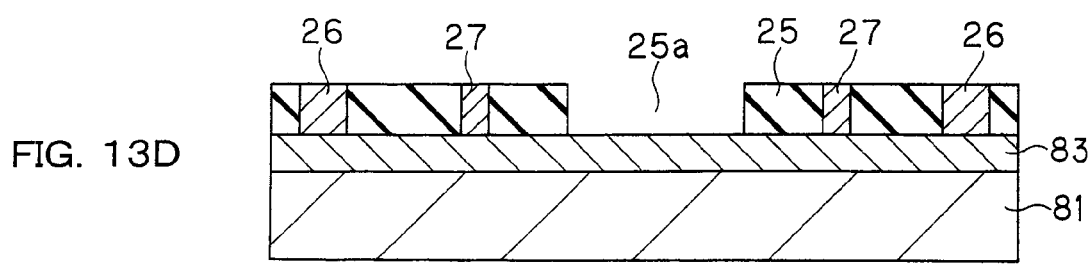
Figure 14A:
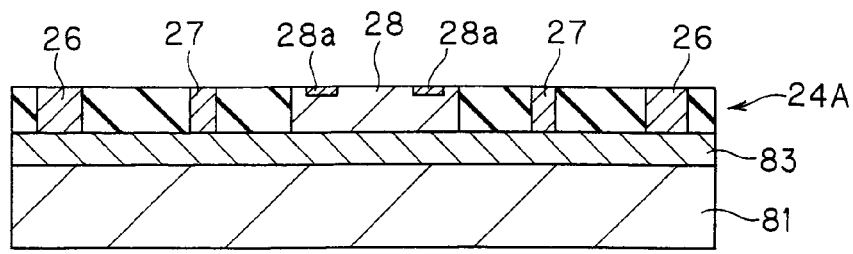
FIGS. 14A to 14D are process diagrams showing the third embodiment of the production method of the electronic device according to the present invention.

Then, the block body 88 is removed to thereby form a cutout portion 25a in the insulating resin layer 25 (FIG. 13D). Thereafter, an electronic component 28 is fitted into the cutout portion 25a to thereby form an electronic component incorporating layer 24A (FIG. 14A). The electronic component 28 may be fixed in the cutout portion 25a by the use of a conductive or insulating adhesive with high heat resistance such as ABLEBOND 3230 (trade name).

Figure 14B:
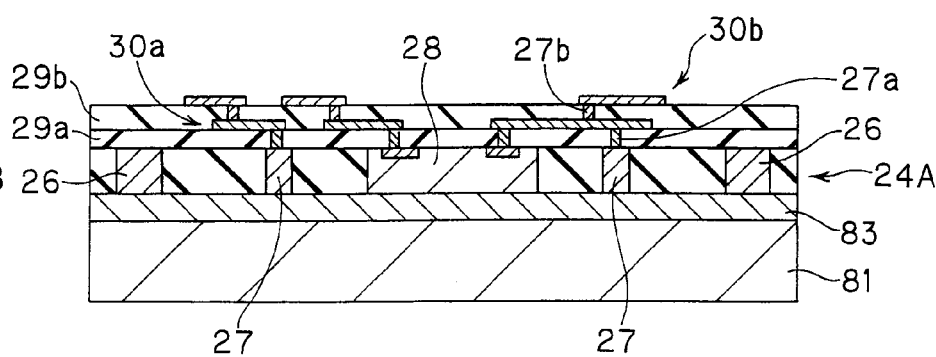

Then, respective wiring layers 30a and 30b are formed via electrically insulating layers 29a and 29b so as to cover the electronic component incorporating layer 24A (FIG. 14B). The formation of the electrically insulating layers 29a and 29b having upper-lower side conducting vias 27a and 27b and the wiring layers 30a and 30b can be carried out in the same manner as the formation of the electrically insulating layer 9a having the upper-lower side conducting vias 7a and the wiring layers 10a in the foregoing embodiment.

Figure 14C:
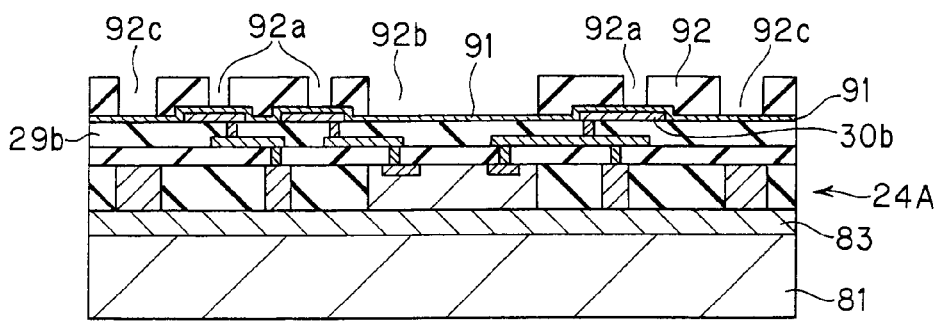

Then, a second-layer (uppermost-layer) electronic component incorporating layer 24B is formed. In this event, a power feed layer 91 is first formed on the electrically insulating layer 29b and the wiring layers 30b, then a plating mask 92 is formed on the power feed layer 91 (FIG. 14C). The power feed layer 91 can be obtained by forming a conductive thin film of chromium, titanium, or the like by the use of the vacuum film forming method or the like. On the other hand, the plating mask 92 can be formed in the same manner as the foregoing plating mask 84. The plating mask 92 has opening portions 92a at positions where later-described conductive columnar convex portions 97 will be formed, an opening portion 92b at a position where a later-described block body 98 will be formed, and further, a continuous opening portion 92c at a position where a later-described frame body 96 will be formed so as to surround the opening portions 92a and 92b. The thickness of the plating mask 92 determines the height of the frame body 96, the height of each conductive columnar convex portion 97, and the thickness of the block body 98 and can be suitably set in the range of, for example, 25 to 400 μm.

Figure 14D:
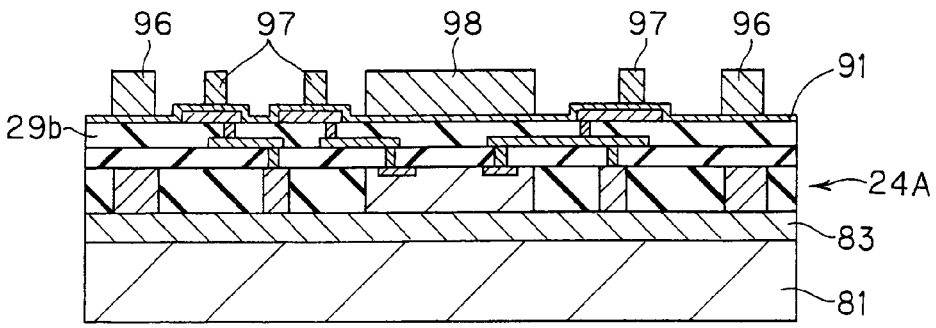

Then, a metal material is deposited on the power feed layer 91 by electrolytic plating via the plating mask 92, then the plating mask 92 is removed, so that there are formed the conductive columnar convex portions 97 for upper-lower side conducting vias, the block body 98 for forming a cutout portion for receiving an electronic component therein, and the frame body 96 surrounding them (FIG. 14D). Each conductive columnar convex portion 97 is located at a predetermined position on the corresponding wiring layer 30b being a lower layer, and the block body 98 is located at a predetermined position on the electrically insulating layer 29b. When producing the electronic device of the present invention having the metal cap, the frame body 96 is formed at a position that finally falls within the electronic device.

This formation of the frame body 96, the conductive columnar convex portions 97, and the block body 98 by the electrolytic plating can be carried out in the same manner as the foregoing formation of the frame body 86, the conductive columnar convex portions 87, and the block body 88 by the electrolytic plating.

Subsequently, the exposed power feed layer 91 is removed (FIG. 15A). Then, an insulating resin layer 25 is formed so as to cover the conductive columnar convex portions 97 and the block body 98 surrounded by the frame body 96, and thereafter, the insulating resin layer 25 is polished so as to expose only top portions of the frame body 96 and the conductive columnar convex portions 97 and only an upper surface of the block body 98 (FIG. 15B). This makes the conductive columnar convex portions 97 become upper-lower side conducting vias 27. The formation of the insulating resin layer 25 can be carried out in the same manner as the foregoing formation of the insulating resin layer 25. In the present invention, owing to the existence of the frame body 96, the formation of the insulating resin layer 25 having a sufficient thickness is facilitated. Even when the frame body 96 is formed at the position surrounding all the panels, it is possible to uniformly and easily form a thick insulating resin layer 25 of several hundreds of micrometers by the potting method and the doctor blade method using the frame body 96 without being affected by the viscosity of the application liquid for formation of the insulating resin layer 25.

Then, the block body 98 is removed to thereby form a cutout portion 25a in the insulating resin layer 25 and an electronic component 28 is fitted into this cutout portion 25a, thereby forming an electronic component incorporating layer 24B (FIG. 15C). The electronic component 28 may be fixed in the cutout portion 25a by the use of a conductive or insulating adhesive with high heat resistance such as ABLEBOND 3230 (trade name).

Then, wiring layers 30c are formed via an electrically insulating layer 29c so as to cover the electronic component incorporating layer 24B. The formation of the electrically insulating layer 29c having upper-lower side conducting vias 27c and the wiring layers 30c can be carried out in the same manner as the foregoing formation of the electrically insulating layer 9a having the upper-lower side conducting vias 7a and the wiring layers 10a.

Then, the base member 81 is removed to expose the metal conductive layer 83 and, by pattern etching the metal conductive layer 83, desired external terminal wiring 23 is formed (FIG. 15D). The removal of the base member 81 can be carried out by polishing, grinding, or the like by the use of a grinder or the like. The pattern etching of the metal conductive layer 83 can be carried out by a known method.

Thereafter, a metal cap is fixed to the metal frame body 26 existing in the uppermost-layer electronic component incorporating layer 24B, so that the electronic device 21 as shown in FIG. 3 can be obtained.

When, as described above, the electronic device 21 is configured such that, like the electronic device 11 being the second embodiment, the flange portion 122 of the metal cap 121 is fixed to the metal frame body 26 of the electronic component incorporating layer 24B via a wiring frame and a wiring frame conductor pattern, the wiring layers 30c and the wiring frame conductor pattern are formed via the electrically insulating layer 29c having the upper-lower side conducting vias 27c and the wiring frame so as to cover the electronic component incorporating layer 24B.

Fourth Embodiment of Production Method

FIGS. 16A to 16C and FIGS. 17A and 17B are process diagrams for describing another embodiment of a production method of an electronic device according to the present invention, wherein the electronic device 31 shown in FIG. 4 is used as an example.

Figure 16A:
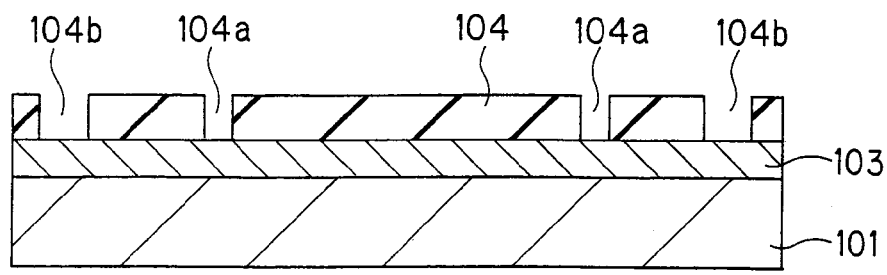
FIGS. 16A to 16C are process diagrams showing a fourth preferred embodiment of a production method of the electronic device according to the present invention.

In the production method of the electronic device according to the present invention, a metal conductive layer 103 is first formed on one surface 101a of a base member 101 and a plating mask 104 is formed on the metal conductive layer 103 (FIG. 16A).

The base member 101 and the metal conductive layer 103 can be the same as the base member 81 and the metal conductive layer 83 in the foregoing third embodiment, respectively.

On the other hand, the plating mask 104 can be formed by, for example, laminating a dry film resist onto the metal conductive layer 103 and carrying out desired patterning exposure and development. The plating mask 104 has opening portions 104a at positions where later-described conductive columnar convex portions 107 will be formed, and a continuous opening portion 104b at a position where a later-described frame body 106 will be formed so as to surround the opening portions 104a. The thickness of the plating mask 104 determines the height of the frame body 106 and the height of each conductive columnar convex portion 107, and can be set such that, for example, the height of the frame body 106 and each conductive columnar convex portion 107 is greater than the thickness of an electronic component 38 to be incorporated by about 10 μm, and suitably set in the range of, for example, 30 to 400 μm.

When producing the electronic devices 31, one shown in FIG. 4, by panelization, the opening portion 104b for forming the frame body 106 may be formed at a position surrounding all the panels or on each of the panels. In this embodiment, the case is shown where the opening portion 104b is formed on each of the panels.

Figure 16B:
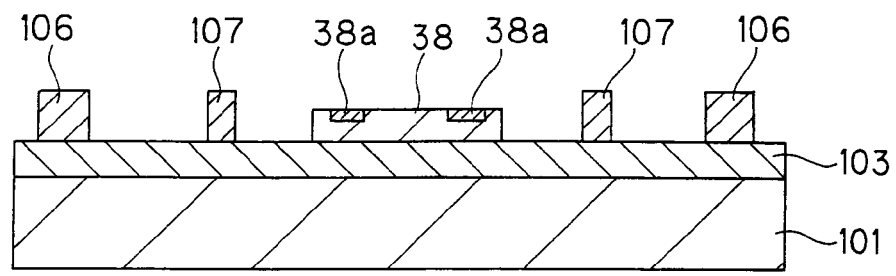

Then, a metal material is deposited on the metal conductive layer 103 by electrolytic plating via the plating mask 104, then the plating mask 104 is removed, so that there are formed the conductive columnar convex portions 107 for upper-lower side conducting vias, and the frame body 106 surrounding them, and thereafter, the electronic component 38 is placed on the metal conductive layer 103 (FIG. 16B). When the frame body 106 is left in each of electronic devices produced by panelization, it is formed at a position that finally falls within the electronic device, while, when not required to remain in each electronic device, it is formed in a border region of each panel. In this embodiment, description will be given about a case where the frame body 106 remains in each electronic device.

The frame body 106 and the conductive columnar convex portions 107 formed by the electrolytic plating may be made of a metal material such as copper, silver, gold, chromium, or aluminum. On the other hand, the electronic component 38 may be fixed on the metal conductive layer 103 by the use of a conductive or insulating adhesive with high heat resistance such as ABLEBOND 3230 (trade name).

Figure 16C:
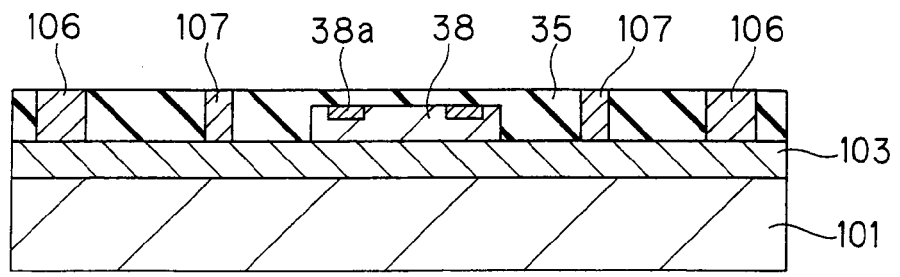
Figure 17A:
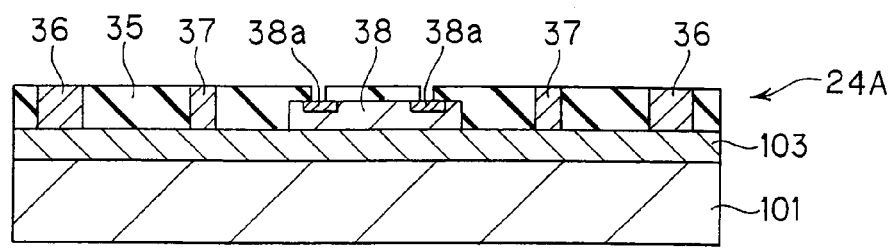
FIGS. 17A and 17B are process diagrams showing the fourth embodiment of the production method of the electronic device according to the present invention.

Then, a photosensitive insulating resin layer 35 is formed so as to cover the electronic component 38 and the conductive columnar convex portions 107 surrounded by the frame body 106, and the insulating resin layer 35 is polished so as to expose top portions of the frame body 106 and the conductive columnar convex portions 107 (FIG. 16C). Thereafter, the insulating resin layer 35 is exposed in a predetermined pattern and developed to thereby expose terminal portions 38a of the electronic component 38 (FIG. 17A). This makes the conductive columnar convex portions 107 become upper-lower side conducting vias 37, thereby forming an electronic component incorporating layer 34A. The formation of the insulating resin layer 35 can be achieved by applying an application liquid containing an electrically insulating resin material such as a photosensitive epoxy resin, benzocyclobutene resin, cardo resin or polyimide resin, or a combination of such an electrically insulating resin material and glass fibers or the like by the use of a known application method, then exposing it by the use of ultraviolet irradiation, electron beam irradiation, or the like, and then developing it. Instead of using the application method as described above, a film may be formed by the electrically insulating resin material or the combination of the electrically insulating resin material and the glass fibers or the like, then laminated, and thereafter exposed by the use of ultraviolet irradiation, electron beam irradiation, or the like and developed, thereby forming the insulating resin layer 35.

In the present invention, owing to the existence of the frame body 106, the formation of the insulating resin layer 35 having a sufficient thickness is facilitated. Even when the frame body 106 is formed at the position surrounding all the panels, it is possible to uniformly and easily form a thick insulating resin layer 35 of several hundreds of micrometers by the potting method and the doctor blade method using the frame body 106 without being affected by the viscosity of the application liquid for formation of the insulating resin layer 35.

Then, respective wiring layers 40a and 40b are formed via electrically insulating layers 39a and 39b so as to cover the electronic component incorporating layer 34A, and an electronic component incorporating layer 34B is formed on the wiring layers 40b (see FIG. 4). The electronic component incorporating layer 34B can be formed in the same manner as the electronic component incorporating layer 14A or 14B in the foregoing second embodiment. Thereafter, wiring layers 40c are further formed via an electrically insulating layer 39c so as to cover the electronic component incorporating layer 34B (see FIG. 4). The formation of the electrically insulating layers 39a, 39b, and 39c having upper-lower side conducting vias 37a, 37b, and 37c and the wiring layers 40a, 40b, and 40c can be carried out in the same manner as the formation of the electrically insulating layer 9a having the upper-lower side conducting vias 7a and the wiring layers 10a in the foregoing first embodiment of the production method.

Figure 17B:
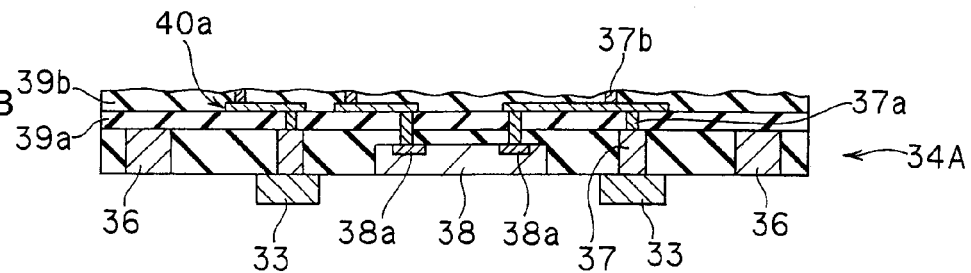

Then, the base member 101 is removed to expose the metal conductive layer 103 and, by pattern etching the metal conductive layer 103, desired external terminal wiring 33 is formed (FIG. 17B). The removal of the base member 101 can be carried out by polishing, grinding, or the like by the use of a grinder or the like. The pattern etching of the metal conductive layer 103 can be carried out by a known method.

Thereafter, a metal cap is fixed to a metal frame body 36 existing in the uppermost-layer electronic component incorporating layer 34B, so that the electronic device 31 as shown in FIG. 4 can be obtained.

When, as described above, the electronic device 31 is configured such that, like the electronic device 11 being the second embodiment, the flange portion 122 of the metal cap 121 is fixed to the metal frame body 36 of the electronic component incorporating layer 34B via a wiring frame and a wiring frame conductor pattern, the wiring layers 40c and the wiring frame conductor pattern are formed via the electrically insulating layer 39c having the upper-lower side conducting vias 37c and the wiring frame so as to cover the electronic component incorporating layer 34B.

The foregoing electronic device production methods of the present invention are each only an example and therefore the present invention is not limited thereto. For example, the plurality of electronic component incorporating layers constituting the electronic device may be formed by the use of different methods among the foregoing forming methods.

Further, in each of the foregoing embodiments of the production methods, the frame body is formed by the electrolytic plating simultaneously with the conductive columnar convex portions for the upper-lower side conducting vias and the block body for formation of the cutout portion for receiving the electronic component therein. However, the present invention is not limited thereto. For example, it may be arranged that conductive columnar convex portions for upper-lower side conducting vias and a block body for formation of a cutout portion for receiving an electronic component therein are formed by electrolytic plating, and thereafter, a frame body formed in advance by molding, processing, or the like is disposed. In this case, when producing the foregoing electronic device 1, 11, 21, or 31, it is necessary to use a metal such as copper or aluminum as a material of the frame body. On the other hand, when a metal frame body is not required to remain in an electronic device, it is also possible to use an epoxy resin, an acrylic resin, or the like. Further, frame bodies of different materials may be used for respective electronic component incorporating layers.

Now, the present invention will be described in further detail showing specific examples, but the present invention is not limited thereto.

EXAMPLE 1

A silicon wafer having a diameter of 150 mm and a thickness of 625 μm was prepared as a core member, and a photosensitive dry film resist (BF405 manufactured by Tokyo Ohka Kogyo Co., Ltd.) was laminated onto one surface of the core member, then exposed and developed via a photomask for through hole formation, thereby forming a mask pattern. The thermal expansion coefficient in XY directions (the plane parallel to the surface of the silicon wafer) of the silicon wafer was 2.5 ppm. The mask pattern was formed with circular openings having a diameter of 100 μm and arranged at a pitch of 500 μm.

Then, using this mask pattern as a mask, the core member was formed with fine holes by sandblasting. This fine hole had an opening diameter of 150 μm, a depth of 300 μm, and an inner diameter at a bottom portion of 50 μm, and had a tapered inner wall surface.

Then, the mask pattern was removed from the core member using acetone. Thereafter, the other surface of the core member was polished to obtain a thickness of 250 μm of the core member by the use of a grinder to thereby expose the fine holes with an opening diameter of 50 μm on the polished surface of the core member, thereby forming through holes.

Then, a thermal oxidation process (1050° C., 20 minutes) was applied to the core member formed with the through holes to thereby form an insulating film of silicon dioxide on the surface (including inner wall surfaces of the through holes) of the core member. Then, a conductive paste containing copper particles was filled into the through holes by screen printing and a curing process (170° C., 20 minutes) was applied thereto. Thereafter, the conductive paste that was cured to protrude from the surface of the core member was polished so that the surfaces of the conductive paste filled in the through holes and the surface of the core member formed the same plane, thereby obtaining a core board. This core board had the tapered through holes each having an opening diameter of 150 μm at its one end and an opening diameter of 50 μm at its other end and arranged at a pitch of 500 μm, and further, electrical conduction between the front and back of the core board was established by the conductive paste.

Then, a power feed layer composed of a chromium layer having a thickness of 0.03 μm and a copper layer having a thickness of 0.2 μm was formed by sputtering on the surface of the core board where the larger-diameter openings of the tapered through holes were exposed. A dry film resist (AX-110 manufactured by Asahi Kasei Corporation) was laminated onto this power feed layer and then subjected to desired patterning exposure and development, thereby forming a plating mask (thickness: 60 μm) with 25 panels (panelization pitch: 20 mm). Electrolytic copper plating was performed via this plating mask and then the plating mask was removed, thereby forming conductive columnar convex portions (height: 50 μm) for upper-lower side conducting vias, block bodies (15 mm×15 mm) each for formation of a cutout portion for receiving an electronic component therein, and frame bodies (width: 500 μm) each having a corridor shape (19 mm×19 mm) and each surrounding the corresponding conductive columnar convex portions and block body. The formed conductive columnar convex portions were located on the conductive paste of the core board, while the formed block bodies were located at positions on the core board that were offset from the positions where the through holes were formed. The frame bodies each had a height of 50 μm and were formed in the number of 25 corresponding to 25 panels, and the forming pitch was set to 20 mm corresponding to the panelization pitch.

Then, exposed portions of the power feed layer were removed by etching. Subsequently, an insulating resin composition (X205 manufactured by Nippon Steel Chemical Co., Ltd.) was applied over the whole surface of the silicon wafer by die coat so as to cover the conductive columnar convex portions and the block bodies surrounded by the frame bodies on the respective panels. Then, a curing process (70° C., 50 minutes) was applied thereto to form an insulating resin layer. Thereafter, chemical mechanical polishing was applied to the insulating resin layer so as to expose only top portions of the frame bodies, top portions of the conductive columnar convex portions, and upper surfaces of the block bodies. Consequently, there was formed an insulating resin layer (thickness: 50 μm) having the upper-lower side conducting vias and the frame bodies surrounding them.

Then, the block bodies on the respective panels were removed by etching to thereby form cutout portions in the insulating resin layer, and the power feed layer remaining in each of the cutout portions was removed by etching. Then, LSI chips (15 mm×15 mm) were fixedly fitted in the cutout portions, respectively, by the use of an adhesive (ABLEBOND 3230 manufactured by Ablestik Japan Co., Ltd.), thereby forming an electronic component incorporating layer.

Then, a benzocyclobutene resin composition (CYCLOTENE 4024 manufactured by The Dow Chemical Company) was applied onto this electronic component incorporating layer by the use of a spin coater and then dried to thereby form an electrically insulating layer having a thickness of 10 μm.

Subsequently, exposure and development were carried out to form small-diameter holes (inner diameter: 20 μm) at predetermined positions of the electrically insulating layer so as to expose the upper-lower side conducting vias and terminal portions of the LSI chips of the electronic component incorporating layer. After descum by dry etching for removing residual films, a conductive layer made of chromium and copper was formed by sputtering in the holes and on the electrically insulating layer, then a liquid resist (LA900 manufactured by Tokyo Ohka Kogyo Co., Ltd.) was applied onto this conductive layer. Note that an example of forming a conductive layer made of titanium and copper instead of forming the conductive layer made of chromium and copper was also progressed in parallel.

Then, exposure and development were carried out via a photomask for first-layer wiring layer formation to thereby form a resist pattern for wiring formation. Using this resist pattern as a mask, electrolytic copper plating (thickness: 4 μm) was performed and thereafter the resist pattern and the conductive layer were removed. Consequently, first-layer wiring layers connected to predetermined portions of the electronic component incorporating layer through upper-lower side conducting vias were formed on the electronic component incorporating layer via the electrically insulating layer, and simultaneously, wiring frames located on the frame bodies were formed. The upper-lower side conducting vias each had a diameter of 20 μm and the wiring frames each had a corridor shape (19 mm×19 mm) having a line width of 20 μm.

Further, the same processes were carried out to form second-layer wiring layers on the first-layer wiring layers via an electrically insulating layer and simultaneously form wiring frames located on the lower-layer wring frames.

Then, by the same processes as those for forming the foregoing electronic component incorporating layer, a second electronic component incorporating layer was formed on the second-layer wiring layers. Thereafter, by the same processes as those for forming the foregoing wiring layers, third-layer wiring layers were formed on the second electronic component incorporating layer via an electrically insulating layer. Note that the electrically insulating layer was formed so as to expose top portions of frame bodies constituting the second electronic component incorporating layer.

Subsequently, a flange portion of a metal cap made of an iron/nickel 42 alloy was fixed, by soldering, to the frame body of the second electronic component incorporating layer being the uppermost layer on each panel. This processing was carried out in an atmosphere of nitrogen gas, wherein the nitrogen gas was filled into the metal cap.

Thereafter, the panels were separated from each other to thereby obtain an electronic device (Example 1) of the present invention having the structure shown in FIG. 1.

EXAMPLE 2

An iron/nickel 42 alloy having 100 mm×100 mm and a thickness of 200 μm was prepared as a base member, and a metal conductive layer having a thickness of 30 μm was formed on one surface of the base member by electrolytic copper plating. The thermal expansion coefficient in XY directions of the 42 alloy used was 8 ppm.

Then, a dry film resist (AX-110 manufactured by Asahi Kasei Corporation) was laminated onto the metal conductive layer and then subjected to desired patterning exposure and development, thereby forming a plating mask (thickness: 90 μm) with 81 panels (panelization pitch: 10 mm). Electrolytic copper plating was performed via this plating mask and then the plating mask was removed, thereby forming, on the metal conductive layer, conductive columnar convex portions (height: 60 μm) for upper-lower side conducting vias and frame bodies (width: 300 μm) each having a corridor shape (9 mm×9 mm) and each surrounding the corresponding conductive columnar convex portions. The formed frame bodies each had a height of 60 μm and were formed in the number of 81 corresponding to 81 panels, and the forming pitch was set to 10 mm corresponding to the panelization pitch.

Subsequently, LSI chips (5 mm×5 mm, thickness: 50 μm) were fixedly placed at predetermined positions on the metal conductive layer by the use of an adhesive (ABLEBOND 3230 manufactured by Ablestik Japan Co., Ltd.).

Then, a photosensitive insulating resin composition (CYCLOTENE 4024 manufactured by The Dow Chemical Company) was applied onto the metal conductive layer by die coat so as to cover the LSI chips and the conductive columnar convex portions surrounded by the frame bodies on the respective panels. Thereafter, mechanical polishing was applied to an insulating resin layer so as to expose top portions of the frame bodies and top portions of the conductive columnar convex portions. Then, exposure was carried out via a photomask to apply a curing process to those portions excluding terminal portions of the LSI chips, and thereafter, development was carried out to expose the terminal portions of the LSI chips. Consequently, an insulating resin layer (thickness: 60 μm) having upper-lower side conducting vias was formed to thereby provide a first electronic component incorporating layer.

Then, like in Example 1, first-layer wiring layers were formed on the first electronic component incorporating layer via an electrically insulating layer, and further, second-layer wiring layers were formed on the first-layer wiring layers via an electrically insulating layer.

Then, a power feed layer composed of a chromium layer having a thickness of 0.03 μm and a copper layer having a thickness of 0.2 μm was formed by sputtering on the second-layer wiring layers. Note that an example of forming a power feed layer composed of a titanium layer having a thickness of 0.03 μm and a copper layer having a thickness of 0.2 μm instead of forming the power feed layer composed of the chromium layer and the copper layer was also progressed in parallel.

Then, a dry film resist (AX-110 manufactured by Asahi Kasei Corporation) was laminated onto the power feed layer and then subjected to desired patterning exposure and development, thereby forming a plating mask (thickness: 90 μm) with 81 panels (panelization pitch: 10 mm). The panelization position was the same as the foregoing electronic component incorporating layer formation. Electrolytic copper plating was performed via this plating mask and then the plating mask was removed, thereby forming, on the power feed layer, conductive columnar convex portions for upper-lower side conducting vias and frame bodies (width: 300 μm) each having a corridor shape (9 mm×9 mm) and each surrounding the corresponding conductive columnar convex portions. The formed frame bodies each had a height of 60 μn and were formed in the number of 81 corresponding to 81 panels, and the forming pitch was set to 10 mm corresponding to the panelization pitch. The formed conductive columnar convex portions were located at predetermined positions on the second-layer wiring layers and each had a height of 60 μm.

Subsequently, exposed portions of the power feed layer were removed by etching and LSI chips (5 mm×5 mm, thickness: 50 μn) were fixedly placed at predetermined positions on the second-layer electrically insulating layer by the use of an adhesive (ABLEBOND 84-3J manufactured by Ablestik Japan Co., Ltd.).

Then, a photosensitive insulating resin composition (PD100 manufactured by Nippon Steel Chemical Co., Ltd.) was applied by die coat so as to cover the LSI chips and the conductive columnar convex portions surrounded by the frame bodies on the respective panels. After drying, mechanical polishing was applied to an insulating resin layer so as to expose top portions of the frame bodies and top portions of the conductive columnar convex portions. Then, exposure was carried out via a photomask to apply a curing process to those portions excluding terminal portions of the LSI chips, and thereafter, development was carried out to expose the terminal portions of the LSI chips. Consequently, an insulating resin layer (thickness: 60 μm) having upper-lower side conducting vias was formed to thereby provide a second electronic component incorporating layer.

Then, like in the processes of forming the foregoing wiring layers, third-layer wiring layers were formed on the second electronic component incorporating layer via an electrically insulating layer. Note that the electrically insulating layer was formed so as to expose top portions of frame bodies constituting the second electronic component incorporating layer.

Then, the 42 alloy being the base member was removed by polishing using a grinder to thereby expose the metal conductive layer in the form of a copper layer. Subsequently, a photosensitive resist (LA900 manufactured by Tokyo Ohka Kogyo Co., Ltd.) was applied onto the exposed metal conductive layer, then exposed via a photomask for external terminal wiring and developed, thereby forming a resist pattern. Using this resist pattern as a mask, the metal conductive layer was etched by copper chloride, then the resist pattern was removed using acetone, thereby forming external terminal wiring connected to the upper-lower side conducting vias of the first electronic component incorporating layer.

Subsequently, a flange portion of a metal cap made of aluminum was fixed, by welding, to the frame body of the second electronic component incorporating layer being the uppermost layer on each panel. This processing was carried out in an atmosphere of nitrogen gas, wherein the nitrogen gas was filled into the metal cap.

Thereafter, the panels were separated from each other to thereby obtain an electronic device (Example 2) of the present invention having the structure shown in FIG. 4.

Comparative Example

An electronic device was produced like in Example 1 except that a second electronic component incorporating layer was formed without a frame body and no wiring frames were formed. Note, however, that, in the process of applying the insulating resin composition (X205 manufactured by Nippon Steel Chemical Co., Ltd.) over the whole surface by die coat in the formation of the second electronic component incorporating layer, the application process was carried out twice, i.e. the insulating resin composition was first applied to a thickness of 30 μm and dried, then it was further applied so as to fully cover the conductive columnar convex portions. Further, a metal cap was mounted by bonding a flange portion thereof to an electrically insulating layer by the use of an epoxy adhesive.

[Evaluation]

The following temperature cycle test was conducted with respect to the electronic devices (Example 1, Example 2, Comparative Example) produced as described above.

(Temperature Cycle Test Method)

In a temperature cycle from −55° C. to 125° C., a heat treatment was carried out for 30 minutes at respective temperatures. This cycle was repeated 3000 times.

The result of the foregoing temperature cycle test is that, with respect to the electronic devices of Examples 1 and 2, since the upper-lower side connection was carried out by plating or sputtering, no stripping or the like occurred at the connecting portions and no falling off of the metal cap occurred. Accordingly, it has been confirmed that the electronic devices of Examples 1 and 2 have high reliability.

On the other hand, falling off of the metal cap occurred in the electronic device of Comparative Example.

What is claimed:

1. An electronic device having wiring layers and electrically insulating layers stacked on a core board and establishing predetermined electrical conduction between the wiring layers through upper-lower side conducting vias provided in the electrically insulating layers, said electronic device comprising:

a plurality of electronic component incorporating layers each having an insulating resin layer, an electronic component incorporated in said insulating resin layer, and an upper-lower side conducting via provided in said insulating resin layer, said electronic component incorporating layer provided at least between one of said wiring layers and one of said electrically insulating layers and/or between said core board and said electrically insulating layer, wherein each of said electronic component incorporating layers is formed by placing the electronic component on a lower layer and directly forming on said lower layer the insulating resin layer having the upper-lower side conducting via so as to incorporate said electronic component therein, and at least the uppermost-layer electronic component incorporating layer of said plurality of electronic component incorporating layers comprises a metal frame body surrounding said electronic component and said upper-lower side conducting via, and a metal cap having a flange portion fixed to said metal frame body of the uppermost layer electronic component incorporating layer is provided.

2. An electronic device according to claim 1, wherein said core board comprises a plurality of through holes each having a conductive material establishing electrical conduction between the front and back of said core board and has a thermal expansion coefficient in XY directions falling within a range of 2 to 20 ppm.

3. An electronic device according to claim 1, wherein said core board has an electronic component incorporated on a side thereof where said wiring layers and said electrically insulating layers are stacked.

4. An electronic device according to claim 1, wherein said electronic component is in the form of one kind or more of LSI chip, IC chip, LCR electronic component, and sensor component.

5. An electronic device having wiring layers and electrically insulating layers stacked on an external terminal wiring layer and establishing predetermined electrical conduction between the wiring layers and the external terminal wiring layer through upper-lower side conducting vias provided in the electrically insulating layers, said electronic device comprising:

a plurality of electronic component incorporating layers each having an insulating resin layer, an electronic component incorporated in said insulating resin layer, and an upper-lower side conducting via provided in said insulating resin layer, said electronic component incorporating layer provided at least between one of said wiring layers and one of said electrically insulating layers and/ or between said external terminal wiring layer and said electrically insulating layer, wherein each of said electronic component incorporating layers is formed by directly forming on a lower layer the insulating resin layer having a cutout portion for receiving the electronic component therein and the upper-lower side conducting via and by incorporating the electronic component in said cutout portion, and at least the uppermost-layer electronic component incorporating layer of said plurality of electronic component incorporating layers comprises a metal frame body surrounding said electronic component and said upper-lower side conducting via, and a metal cap having a flange portion fixed to said metal frame body of the uppermost-layer electronic component incorporating layer is provided.

6. An electronic device according to claim 5, wherein said electronic component is in the form of one kind or more of LSI chip, IC chip, LCR electronic component, and sensor component.

7. An electronic device having wiring layers and electrically insulating layers stacked on an external terminal wiring layer and establishing predetermined electrical conduction between the wiring layers and the external terminal wiring layer through upper-lower side conducting vias provided in the electrically insulating layers, said electronic device comprising:

a plurality of electronic component incorporating layers each having an insulating resin layer, an electronic component incorporated in said insulating resin layer, and an upper-lower side conducting via provided in said insulating resin layer, said electronic component incorporating layer provided at least between one of said wiring layers and one of said electrically insulating layers and/or between said external terminal wiring layer and said electrically insulating layer, wherein each of said electronic component incorporating layers is formed by placing the electronic component on a lower layer and directly forming on said lower layer the insulating resin layer having the upper-lower side conducting via so as to incorporate said electronic component therein, and at least the uppermost-layer electronic component incorporating layer of said plurality of electronic component incorporating layers comprises a metal frame body surrounding said electronic component and said upper-lower side conducting via, and a metal cap having a flange portion fixed to said metal frame body of the uppermost layer electronic component incorporating layer is provided.

8. An electronic device according to claim 7, wherein said electronic component is in the form of one kind or more of LSI chip, IC chip, LCR electronic component, and sensor component.

9. A production method of an electronic device having wiring layers and electrically insulating layers stacked on a core board, establishing predetermined electrical conduction between the wiring layers through upper-lower side conducting vias provided in the electrically insulating layers, and incorporating an electronic component, said production method comprising the steps of:

forming a conductive columnar convex portion for an upper-lower side conducting via, a block body for formation of a cutout portion for receiving the electronic component therein, and a frame body surrounding them, on the core board or on the wiring layer formed on the core board via the electrically insulating layer;

forming an insulating resin layer so as to expose a top portion of said conductive columnar convex portion and an upper surface of said block body that are surrounded by said frame body; and fitting the electronic component into said cutout portion formed by removing said block body to thereby form an electronic component incorporating layer having the electronic component incorporated in said insulating resin layer and the upper-lower side conducting via in said insulating resin layer.

10. A production method of an electronic device according to claim 9, further comprising a step of forming a wiring layer on said electronic component incorporating layer via an electrically insulating layer.

11. A production method of an electronic device according to claim 9, wherein said core board is used for producing electronic devices by panelization and said frame body is formed at a. position surrounding all the electronic devices panelized.

12. A production method of an electronic device according to claim 9, wherein said core board is used for producing electronic devices by panelization and said frame body is formed at a position surrounding each of the electronic devices panelized.

13. A production method of an electronic device according to claim 9, wherein said core board is used for producing electronic devices by panelization and said frame body is formed of metal at a position surrounding each of the electronic devices panelized, and wherein said frame body is left, without removal thereof, in at least an uppermost-layer electronic component incorporating layer of a plurality of electronic component incorporating layers and a flange portion of a metal cap is fixed to said frame body.

14. A production method of an electronic device having wiring layers and electrically insulating layers stacked on a core board, establishing predetermined electrical conduction between the wiring layers through upper-lower side conducting vias provided in the electrically insulating layers, and incorporating an electronic component, said production method comprising the steps of:

forming a conductive columnar convex portion for an upper-lower side conducting via and a frame body surrounding said conductive columnar convex portion, on the core board or on the wiring layer formed on the core board via the electrically insulating layer, and placing the electronic component inside said frame body; and forming an insulating resin layer so as to incorporate therein said electronic component surrounded by said frame body and expose a top portion of said conductive columnar convex portion and terminal portions of said electronic component to thereby form an electronic component incorporating layer having the electronic component incorporated in said insulating resin layer and the upper-lower side conducting via in said insulating resin layer.

15. A production method of an electronic device according to claim 14, further comprising a step of forming a wiring layer on said electronic component incorporating layer via an electrically insulating layer.

16. A production method of an electronic device according to claim 14, wherein said core board is used for producing electronic devices by panelization and said frame body is formed at a position surrounding all the electronic devices panelized.

17. A production method of an electronic device according to claim 14, wherein said core board is used for producing electronic devices by panelization and said frame body is formed at a position surrounding each of the electronic devices panelized.

18. A production method of an electronic device according to claim 14, wherein said core board is used for producing electronic devices by panelization and said frame body is formed of metal at a position surrounding each of the electronic devices panelized, and wherein said frame body is left, without removal thereof, in at least an uppermost-layer electronic component incorporating layer of a plurality of electronic component incorporating layers and a flange portion of a metal cap is fixed to said frame body.

19. A production method of an electronic device having wiring layers and electrically insulating layers stacked on an external terminal wiring layer, establishing predetermined electrical conduction between the wiring layers and the external terminal wiring layer through upper-lower side conducting vias provided in the electrically insulating layers, and incorporating an electronic component, said production method comprising the steps of:
    forming a conductive columnar convex portion for an upper-lower side conducting via, a block body for formation of a cutout portion for receiving the electronic component therein, and a frame body surrounding them, on a metal conductive layer formed on a base member or on the wiring layer formed on said metal conductive layer via the electrically insulating layer;
    forming an insulating resin layer so as to expose a. top portion of said conductive columnar convex portion and an upper surface of said block body that are surrounded by said frame body;
    fitting the electronic component into said cutout portion formed by removing said block body to thereby form an electronic component incorporating layer having the electronic component incorporated in said insulating resin layer and the upper-lower side conducting via in said insulating resin layer; and
    removing said base member to expose said metal conductive layer and then pattern etching said metal conductive layer to form external terminal wiring.

20. A production method of an electronic device according to claim 19, further comprising a step of forming a wiring layer on said electronic component incorporating layer via an electrically insulating layer.

21. A production method of an electronic device according to claim 19, wherein said base member has a thermal expansion coefficient in XY directions falling within a range of 2 to 20 ppm.

22. A production method of an electronic device according to claim 19, wherein said base member is made of one of silicon, glass, and a 42 alloy.

23. A production method of an electronic device according to claim 19, wherein said metal conductive layer is made of copper.

24. A production method of an electronic device according to claim 19, wherein said base member is used for producing electronic devices by panelization and said frame body is formed at a position surrounding all the electronic devices panelized.

25. A production method of an electronic device according to claim 19, wherein said base member is used for producing electronic devices by panelization and said frame body is formed at a position surrounding each of the electronic devices panelized.

26. A production method of an electronic device according to claim 19, wherein said base member is used for producing electronic devices by panelization and said frame body is formed of metal at a position surrounding each of the electronic devices panelized, and wherein said frame body is left, without removal thereof, in at least an uppermost-layer electronic component incorporating layer of a plurality of electronic component incorporating layers and a flange portion of a metal cap is fixed to said frame body.

27. A production method of an electronic device having wiring layers and electrically insulating layers stacked on an external terminal wiring layer, establishing predetermined electrical conduction between the wiring layers and the external terminal wiring layer through upper-lower side conducting vias provided in the electrically insulating layers, and incorporating an electronic component, said production method comprising the steps of:
    forming a conductive columnar convex portion for an upper-lower side conducting via and a frame body surrounding said conductive columnar convex portion, on a metal conductive layer formed on a base member or on the wiring layer formed on said metal conductive layer via the electrically insulating layer;
    forming an insulating resin layer so as to incorporate therein said electronic component surrounded by said frame body and expose a top portion of said conductive columnar convex portion and terminal portions of said electronic component to thereby form an electronic component incorporating layer having the electronic component incorporated in said insulating resin layer and the upper-lower side conducting via in said insulating resin layer; and
    removing said base member to expose said metal conductive layer and then pattern etching said metal conductive layer to form external terminal wiring.

28. A production method of an electronic device according to claim 27, further comprising a step of forming a wiring layer on said electronic component incorporating layer via an electrically insulating layer.

29. A production method of an electronic device according to claim 27, wherein said base member has a thermal expansion coefficient in XY directions falling within a range of 2 to 20 ppm.

30. A production method of an electronic device according to claim 27, wherein said base member is made of one of silicon, glass, and a 42 alloy.

31. A production method of an electronic device according to claim 27, wherein said metal conductive layer is made of copper.

32. A production method of an electronic device according to claim 27, wherein said base member is used for producing electronic devices by panelization and said frame body is formed at a position surrounding all the electronic devices panelized.

33. A production method of an electronic device according to claim 27, wherein said base member is used for producing electronic devices by panelization and said frame body is formed at a position surrounding each of the electronic devices panelized.

34. A production method of an electronic device according to claim 27, wherein said base member is used for producing electronic devices by panelization and said frame body is formed of metal at a position surrounding each of the electronic devices panelized, and wherein said frame body is left, without removal thereof, in at least an uppermost-layer electronic component incorporating layer of a plurality of electronic component incorporating layers and a flange portion of a metal cap is fixed to said frame body.

* * * * *